(12) United States Patent
Ting et al.

(10) Patent No.: US 12,482,753 B2
(45) Date of Patent: Nov. 25, 2025

(54) SEMICONDUCTOR DEVICE HAVING REDISTRIBUTION LAYERS FORMED ON AN ACTIVE WAFER AND METHODS OF MAKING THE SAME

(71) Applicant: Taiwan Semiconductor Manufacturing Company Limited, Hsinchu (TW)

(72) Inventors: Kuo-Chiang Ting, Hsinchu (TW); Tu-Hao Yu, Hsinchu (TW); Shun-Jang Laio, Pingjhen (TW); Chien-Chung Wang, New Taipei (TW); Chia-Ching Lin, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 629 days.

(21) Appl. No.: 17/886,509

(22) Filed: Aug. 12, 2022

(65) Prior Publication Data

US 2023/0307374 A1    Sep. 28, 2023

Related U.S. Application Data

(60) Provisional application No. 63/322,880, filed on Mar. 23, 2022.

(51) Int. Cl.
*H01L 23/538* (2006.01)
*H01L 23/00* (2006.01)
(Continued)

(52) U.S. Cl.
CPC ........ *H01L 23/5384* (2013.01); *H01L 23/147* (2013.01); *H01L 23/49816* (2013.01);
(Continued)

(58) Field of Classification Search
CPC ............... H01L 23/5384; H01L 23/147; H01L 23/49816; H01L 24/16; H01L 24/32;
(Continued)

(56) References Cited

U.S. PATENT DOCUMENTS 11,410,984 B1 * 8/2022 Current ............ H01L 21/26506
2020/0098811 A1 * 3/2020 Chen ................. H01L 21/76898
(Continued)

FOREIGN PATENT DOCUMENTS

| CN | 101373742 A | 2/2009 |
|---|---|---|
| TW | 201919175 A | 5/2019 |
| TW | 202203377 A | 1/2022 |

OTHER PUBLICATIONS

Jianq Chyun Intellectual Property Office; TW Application No. 112100740; Office Action mailed May 9, 2024; 16 pages.
(Continued)

*Primary Examiner* — Jonathan Han
(74) *Attorney, Agent, or Firm* — The Marbury Law Group, PLLC

(57) ABSTRACT

An embodiment semiconductor device may include a semiconductor die; one or more redistribution layers formed on a surface of the semiconductor die and electrically coupled to the semiconductor die; and an active or passive electrical device electrically coupled to the one or more redistribution layers. The active or passive electrical device may include a silicon substrate and a through-silicon-via formed in the silicon substrate. The active or passive electrical device may be configured as an integrated passive device including a deep trench capacitor or as a local silicon interconnect. The semiconductor device may further include a molding material matrix formed on a surface of the one or more redistri-
(Continued)

bution layers such that the molding material matrix partially or completely surrounds the active or passive electrical device.

20 Claims, 22 Drawing Sheets

(51) Int. Cl.
*H01L 23/14* (2006.01)
*H01L 23/498* (2006.01)
*H01L 25/065* (2023.01)
*H10D 1/68* (2025.01)

(52) U.S. Cl.
CPC ............. *H01L 24/16* (2013.01); *H01L 24/32* (2013.01); *H01L 24/73* (2013.01); *H01L 25/0655* (2013.01); *H10D 1/68* (2025.01); H01L 2224/16012 (2013.01); H01L 2224/16157 (2013.01); H01L 2224/32137 (2013.01); H01L 2224/73104 (2013.01)

(58) Field of Classification Search
CPC ................ H01L 24/73; H01L 25/0655; H01L 2224/16012; H01L 2224/16157; H01L 2224/32137; H01L 2224/73104; H01L 23/5385; H01L 23/5389; H01L 23/585; H01L 25/0657; H01L 25/50; H01L 2224/73204; H01L 2224/81; H01L 21/76898; H01L 23/64; H01L 24/14; H01L 25/16; H10D 1/68; H10D 1/692
See application file for complete search history.

(56) References Cited

U.S. PATENT DOCUMENTS

| | | | |
|---|---|---|---|
| 2021/0082894 A1* | 3/2021 | Chen | H10D 84/01 |
| 2021/0242184 A1* | 8/2021 | Fong | H10D 88/01 |
| 2021/0265280 A1* | 8/2021 | Shih | H01L 21/561 |

OTHER PUBLICATIONS

Taiwan Patent & Trademark Office; TW Application No. 112100740; Office Action dated Jul. 5, 2023; 6 pages.

* cited by examiner

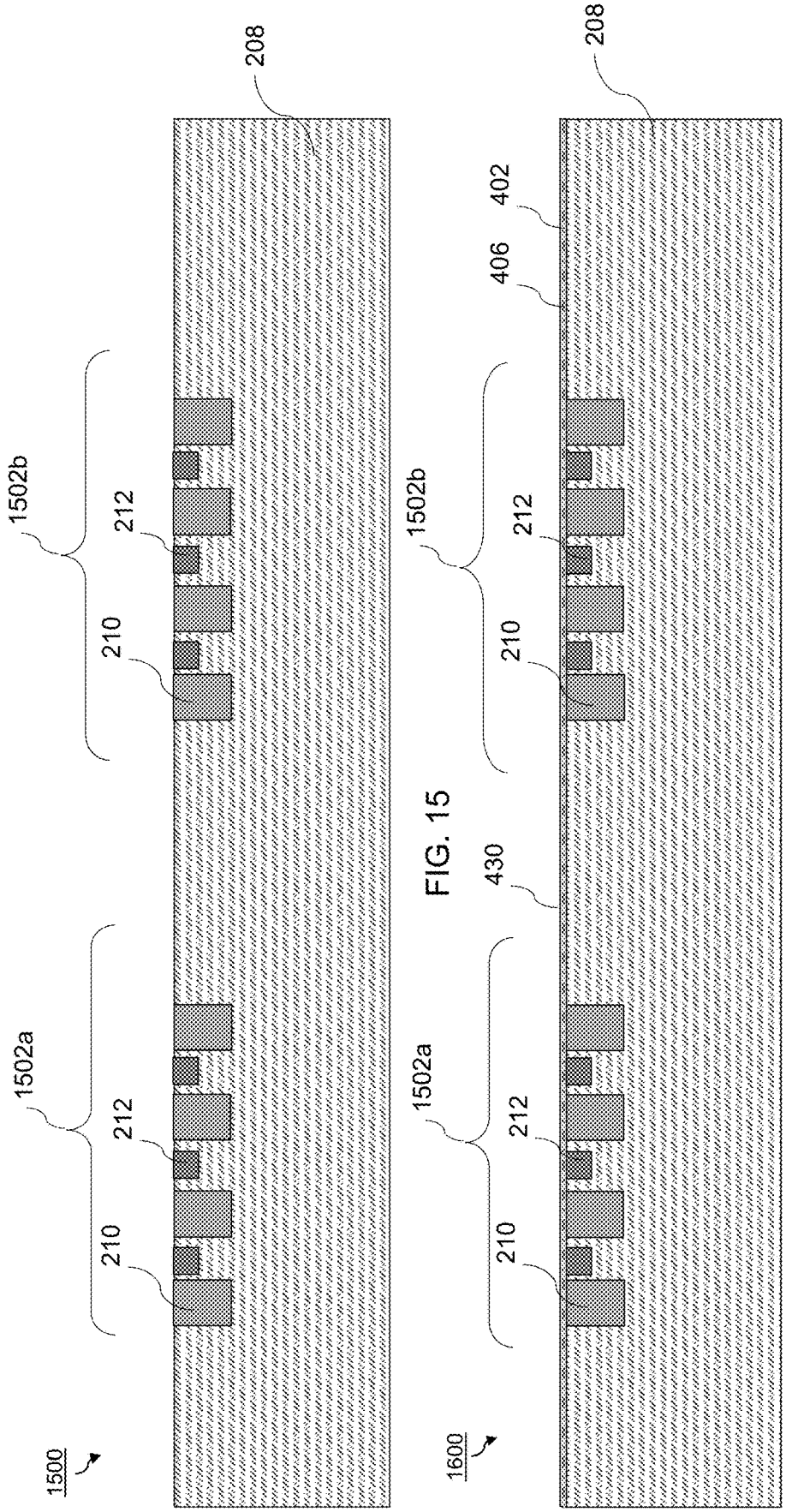

SEMICONDUCTOR DEVICE HAVING REDISTRIBUTION LAYERS FORMED ON AN ACTIVE WAFER AND METHODS OF MAKING THE SAME

RELATED APPLICATION

This application claims priority to U.S. Provisional Patent Application No. 63/322,880 entitled "CoW Lite Architecture" filed on Mar. 23, 2022, the entire contents of which are hereby incorporated by reference for all purposes.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds or thousands of integrated circuits are typically manufactured on a single semiconductor wafer, and individual dies on the wafer are singulated by sawing between the integrated circuits along scribe lines. The individual dies are typically packaged separately, in multi-chip modules, or in other types of packaging, for example.

In addition to smaller electronic components, improvements to the packaging of components have been developed in an effort to provide smaller packages that occupy less area than previous packages. Example approaches include quad flat pack (QFP), pin grid array (PGA), ball grid array (BGA), flip chips (FC), 3-dimensional integrated circuits (3DICs), wafer level packages (WLPs), package on package (PoP), System on Chip (SoC) or System on Integrated Circuit (SoIC) devices. Some of these 3-dimensional devices (e.g., 3DIC, SoC, SoIC) are prepared by placing chips over chips on a semiconductor wafer level. These 3-dimensional devices provide improved integration density and other advantages, such as faster speeds and higher bandwidth, because of the decreased length of interconnects between the stacked chips. However, there are many challenges related to 3-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 is a vertical cross-sectional view of an intermediate structure that may be used in the formation of an active or passive device, according to various embodiments.

FIG. 16 is a vertical cross-sectional view of a further intermediate structure that may be used in the formation of an active or passive device, according to various embodiments.

DETAILED DESCRIPTION

Figure 1A:
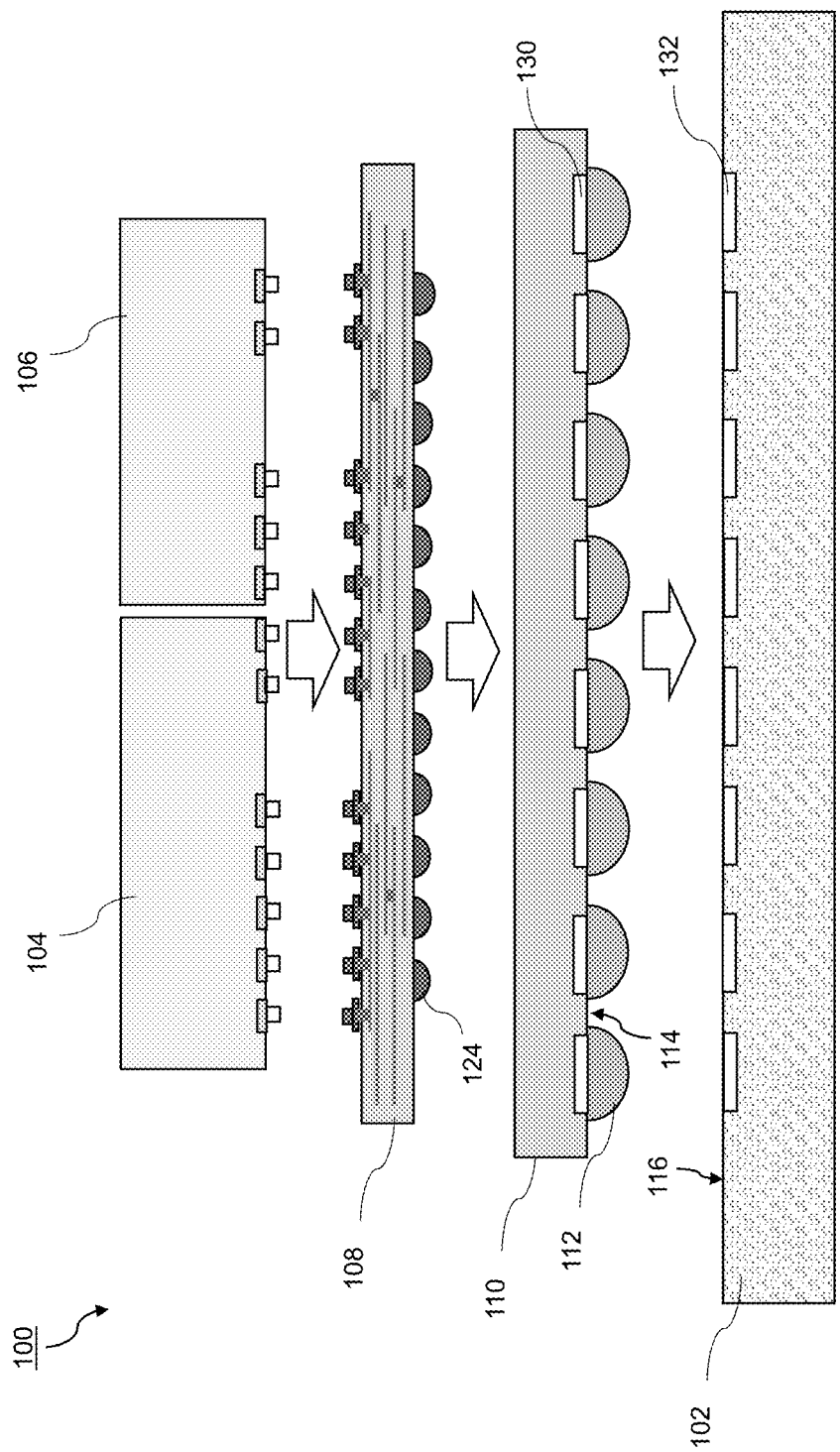
FIG. 1A is vertical cross-sectional exploded view of components of a related semiconductor package during a package assembly and surface mounting process.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate, which may also be referred to as a "package substrate." In some embodiments, electrical connections to the semiconductor package may be made by mounting the package substrate onto a support substrate containing electrical interconnects, such as a printed circuit board (PCB). A semiconductor package may further include an interposer to which one or more semiconductor dies are attached and electrically coupled. The interposer, in turn, may be attached and electrically coupled to a package substrate, which may be further attached to a PCB. As such, separate structures (e.g., semiconductor dies, interposer, package substrate, and PCB) may be fabricated and then assembled.

Various embodiments disclosed herein may simplify the formation of a semiconductor package structure by providing a semiconductor device that includes redistribution interconnect layers (similar to those of an interposer) formed directly on an active wafer or semiconductor die. In this way, a number of processing steps may be reduced and the use of intermediate carrier substrates (such as an interposer) may be avoided. In such embodiments, the active wafer (or semiconductor die), itself, may serve as the only substrate used in forming the semiconductor device. Such a semiconductor device may be configured as a modular component that may be attached to a package substrate without an interposer. In some embodiments, the redistribution layers of the semiconductor device may have a smaller lateral extent than those of an interposer that may be formed separately. This smaller size may act to reduce or mitigate issues related to thermal expansion stresses that may otherwise exist in a semiconductor package having semiconductor dies attached to a separate interposer.

An embodiment semiconductor device may include a semiconductor die; one or more redistribution layers formed on a surface of the semiconductor die and electrically coupled to the semiconductor die; and an active or passive electrical device electrically coupled to the one or more redistribution layers. The active or passive electrical device may include a silicon substrate and a through-silicon-via formed in the silicon substrate. The active or passive electrical device may be configured as an integrated passive device including a deep trench capacitor or as a local silicon interconnect. The semiconductor device may further include a molding material matrix formed on a surface of the one or more redistribution layers such that the molding material matrix partially or completely surrounds the active or passive electrical device.

An embodiment method of fabricating a semiconductor device may include forming a plurality of field-effect transistors on or within a semiconductor substrate to form an active wafer; forming one or more redistribution layers on a surface of the active wafer such that the one or more redistribution layers are electrically coupled to the plurality of field-effect transistors; and electrically coupling an active or passive electrical device to the one or more redistribution layers. The method may further include forming a molding material matrix on a surface of the one or more redistribution layers such that the molding material matrix partially or completely surrounds the active or passive electrical device. The method may further include forming a through-molding-material via such that the through-molding-material via is electrically coupled to the one or more redistribution layers.

According to an embodiment, the active or passive device may further include a silicon substrate and a through-silicon-via, and the method may further include forming metal bonding structures over top surfaces of the through-silicon-via and the through-molding-material via such that the metal bonding structures are electrically coupled to the through-silicon-via and the through-molding-material via. The method may further include forming a solder mask over the molding material matrix prior to forming the metal bonding structures such that the solder mask includes openings through which top surfaces of the through-silicon-via and the through-molding-material via are exposed.

A further embodiment method of fabricating a semiconductor device may include forming one or more redistribution layers on a surface of a semiconductor die such that the one or more redistribution layers are electrically coupled to the semiconductor die; forming a molding material matrix on a surface of the one or more redistribution layers; and forming a through-molding-material via that is electrically coupled to the one or more redistribution layers. The method may further include electrically coupling an active or passive electrical device to the one or more redistribution layers. The operation of forming the molding material matrix may further include partially or completely surrounding the active or passive electrical device with the molding material matrix. The method may further include forming the active or passive electrical device such that the active or passive device includes a silicon substrate and a through-silicon-via formed in the silicon substrate. The method may further include forming the active or passive electrical device as an integrated passive device comprising a deep trench capacitor. In a further embodiment, the method may include forming the active or passive electrical device as a local silicon interconnect that provides electrical connections between two or more circuit components of the semiconductor die.

Figure 1B:
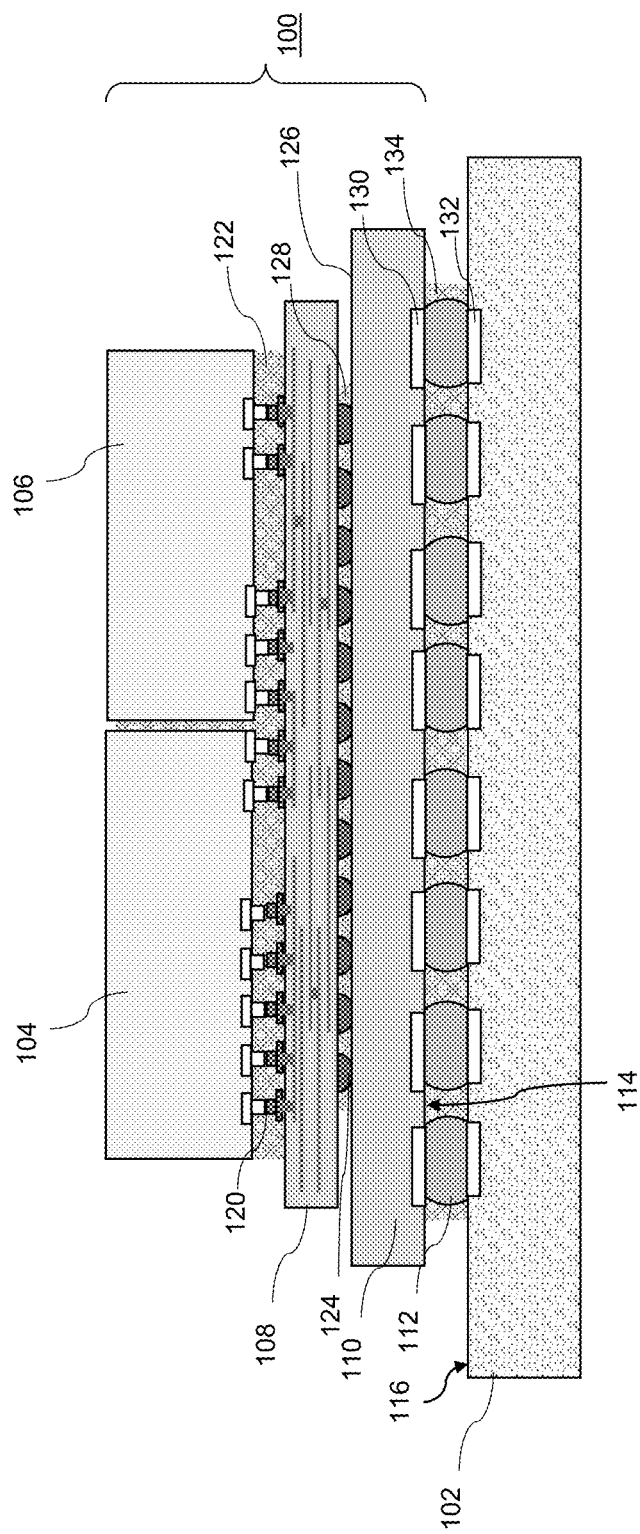
FIG. 1B is a vertical cross-sectional view illustrating a related assembled semiconductor package mounted onto the surface of a support substrate.

FIG. 1A is vertical cross-section exploded view of components of a related semiconductor package 100 during a package assembly and surface mounting process. FIG. 1B is a vertical cross-section view illustrating the related assembled semiconductor package 100 mounted onto the surface of a support substrate 102, such as a printed circuit board (PCB). The semiconductor package 100 in this example is a chip-on-wafer-on-substrate (CoWoS)® semiconductor package, although it will be understood that a similar assembly and mounting process may be utilized for other types of semiconductor packages, such as integrated fan-out (InFO) semiconductor packages, flip-chip semiconductor packages, etc.

Referring to FIGS. 1A and 1B, the related semiconductor package 100 may include integrated circuit (IC) semiconductor devices, such as first semiconductor devices 104 and second semiconductor devices 106. During the package assembly process, the first semiconductor device 104 and the second semiconductor device 106 may be mounted on an interposer 108, and the interposer 108 containing the first semiconductor device 104 and the second semiconductor device 106 may be mounted onto a package substrate 110 to form a semiconductor package 100. The semiconductor package 100 may then be mounted to a support substrate 102, such as a printed circuit board (PCB), by mounting the package substrate 110 to the support substrate 102 using an array of first solder balls 112 on the lower surface 114 of the package substrate 110.

A parameter that may ensure proper interconnection between the package substrate 110 and the support substrate 102 is the degree of co-planarity between the surfaces of the first solder balls 112 that may be brought into contact with the mounting surface (i.e., the upper surface 116 of the support substrate 102 in FIG. 1A). A low degree of co-planarity between the first solder balls 112 may result in instances of solder cold joints (i.e., insufficient melting of the solder material, resulting in a poor bond that is susceptible to cracking and separation) and/or solder bridging issues (i.e., solder material from one solder ball 112 contacting material from a neighboring solder ball 112, resulting in an unintended connection (i.e., electrical short)) during the reflow process.

Deformation of the package substrate 110, such as stress-induced warping of the package substrate 110, may be a contributor to low co-planarity of the first solder balls 112 during surface mounting of the package substrate 110 onto a support substrate 102. Deformation of the package substrate 110 is not an uncommon occurrence, particularly in the case of semiconductor packages 100 used in high-performance computing applications. These high-performance semiconductor packages 100 tend to be relatively large and may include a number of semiconductor devices (e.g., 104, 106) mounted to the package substrate 110, which may increase a likelihood that the package substrate 110 may be subject to warping or other deformations. Such deformations may present challenges to effective solder mounting of these types of semiconductor package substrates 110 onto a support substrate 102.

Various disclosed embodiments may include semiconductor devices having redistribution layers formed directly on an active wafer or semiconductor die, as described in greater detail (e.g., see FIG. 2), below. Such structures may be configured to be attached directly to the package substrate 110 without the need for a separate interposer 108. As such, embodiment structures may be more modular, simpler to fabricate, and may have fewer issues related to stress-induced warping of the package substrate 110, as described in greater detail, below.

In various embodiments, the first semiconductor devices 104 may be three-dimensional devices, such as three-dimensional integrated circuits (3DICs), System on Chip (SOC) or System on Integrated Circuit (SoIC) devices. A three-dimensional semiconductor device 104 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional semiconductor device 104 may also be referred to as a "first die stack."

The second semiconductor device(s) 106 may be different from the first semiconductor device(s) 104 in terms of their structure, design and/or functionality. The one or more second semiconductor devices 106 may be three-dimensional semiconductor devices, which may also be referred to as "second die stacks." In some embodiments, the one or more second semiconductor devices 106 may include a memory device, such as a high bandwidth memory (HBM) device. In the example shown in FIGS. 1A and 1B, the semiconductor package 100 may include a SOC die stack 104 and an HBM die stack 106, although it will be understood that the semiconductor package 100 may include greater or fewer numbers of semiconductor devices.

Referring again to FIG. 1B, the first semiconductor devices 104 and second semiconductor devices 106 may be mounted on an interposer 108. In some instances, the interposer 108 may be an organic interposer including a polymer dielectric material (e.g., a polyimide material) having a plurality of metal interconnect structures extending therethrough. In other instances, the interposer 108 may be a semiconductor interposer, such as a silicon interposer, having a plurality of interconnect structures (e.g., through-silicon vias) extending therethrough. Other suitable configurations for the interposer 108 are within the contemplated scope of the disclosure. The interposer 108 may include a plurality of conductive bonding pads on upper and lower surfaces of the interposer and a plurality of conductive interconnects extending through the interposer 108 between the upper and lower bonding pads of the interposer 108. The conductive interconnects may distribute and route electrical signals between the first semiconductor devices 104, the second semiconductor devices 106, and the underlying package substrate 110. Thus, the interposer 108 may also be referred to as a redistribution layer (RDL).

A plurality of first metal bumps 120, such as microbumps, may electrically connect conductive bonding pads on the bottom surfaces of the first semiconductor devices 104 and second semiconductor devices 106 to the conductive bonding pads on the upper surface of the interposer 108. In one non-limiting embodiment, first metal bumps 120 in the form of microbumps may include a plurality of first metal stacks, such as a plurality of Cu—Ni—Cu stacks, located on the bottom surfaces of the first semiconductor devices 104 and second semiconductor devices 106, and a plurality of second metal stacks (e.g., Cu—Ni—Cu stacks) located on the upper surface of the interposer 108. A solder material, such as tin (Sn), may be located between respective first and second metal stacks to electrically connect the first semiconductor devices 104 and the second semiconductor devices 106 to the interposer 108. Other suitable materials for the first metal bumps 120 are within the contemplated scope of disclosure.

After the first semiconductor devices 104 and second semiconductor devices 106 are mounted to the interposer 108, a first underfill material portion 122 may optionally be provided in the spaces surrounding the first metal bumps 120 and between the bottom surfaces of the first semiconductor devices 104, the second semiconductor devices 106, and the upper surface of the interposer 108 as shown in FIG. 1B. The first underfill material portion 122 may also be provided in the spaces laterally separating adjacent first semiconductor devices 104 and second semiconductor devices 106 of the semiconductor package 100. In various embodiments, the first underfill material portion 122 may be include of an epoxy-based material, which may include a composite of resin and filler materials.

Referring again to FIG. 1B, the interposer 108 may be mounted on the package substrate 110 that may provide mechanical support for the interposer 108 and the first semiconductor devices 104 and second semiconductor devices 106 that are mounted on the interposer 108. The package substrate 110 may include a suitable material, such as an organic material (e.g., a polymer and/or thermoplastic material), a semiconductor material (e.g., a semiconductor wafer, such as a silicon wafer), a ceramic material, a glass material, combinations thereof, etc. Other suitable substrate materials are within the contemplated scope of present disclosure. In various embodiments, the package substrate 110 may include a plurality of conductive bonding pads (not shown) in an upper surface 126 of the package substrate 110. A plurality of second metal bumps 124, such as C4 solder bumps, may electrically connect conductive bonding pads (not shown) on the bottom surface of the interposer 108 to the conductive bonding pads on the upper surface 126 of the package substrate 110. In various embodiments, the second metal bumps 124 may include a suitable solder material, such as tin (Sn), although other suitable solder materials are within the contemplated scope of disclosure.

A second underfill material portion 128 may be provided in the spaces surrounding the second metal bumps 124 and between the bottom surface of the interposer 108 and the upper surface 126 of the package substrate 110 as illustrated, for example, in FIG. 1B. In various embodiments, the second underfill material portion 128 may include an epoxy-based material, which may include a composite of resin and filler materials. In some embodiments, a lid or cover (not shown in FIGS. 1A and 1B) may be mounted to the package substrate 110 and may provide an enclosure around the upper and side surfaces of the first semiconductor devices 104 and second semiconductor devices 106.

As described above, the package substrate 110 may be mounted to the support substrate 102, such as a printed circuit board (PCB). Other suitable support substrates 102 are within the contemplated scope of disclosure. The package substrate 110 may include a plurality of conductive bonding pads 130 in a lower surface 114 of the package substrate 110. A plurality of conductive interconnects (not shown) may extend through the package substrate 110 between conductive bonding pads on the upper surface 126 and lower surface 114 of the package substrate 110. The plurality of first solder balls 112 (or bump structures) may electrically connect the conductive bonding pads 130 on the lower surface 114 of the package substrate 110 to a plurality of conductive bonding pads 132 on the upper surface 116 of the support substrate 102.

The bonding pads 130 of the package substrate 110 and bonding pads 132 of the support substrate 102 may be formed of a suitable conductive material, such as copper. Other suitable conductive materials are within the contemplated scope of disclosure. The plurality of first solder balls 112 on the lower surface 114 of the package substrate 110 may form an array of first solder balls 112, such as a ball grid array (BGA) that may include an array pattern that corresponds to an array pattern of the conductive bonding pads 132 on the upper surface 116 of the support substrate 102. In one non-limiting example, the array of first solder balls 112 may include a grid pattern and may have a pitch (i.e., distance between the center of each solder ball 112 and the center of each adjacent solder ball 112). In an example embodiment, the pitch may be between about 0.8 and 1.0 mm, although larger and smaller pitches may be used.

The first solder balls 112 may include any suitable solder material, such as tin, lead, silver, indium, zinc, nickel, bismuth, antimony, cobalt, copper, germanium, alloys thereof, combinations thereof, or the like. Other suitable materials for the first solder balls 112 are within the contemplated scope of disclosure.

In some embodiments, the lower surface 114 of the package substrate 110 may include a coating of solder resist (SR) material (not shown), which may also be referred to as a "solder mask". A SR material coating may provide a protective coating for the package substrate 110 and any underlying circuit patterns formed on or within the package substrate 110. An SR material coating may also inhibit solder material from adhering to the lower surface 114 of the package substrate 110 during a reflow process. In embodiments in which the lower surface 114 of the package substrate 110 includes an SR coating, the SR material coating may include a plurality of openings through which the bonding pads 130 may be exposed.

In various embodiments, each of the conductive bonding pads 130 in different regions of the package substrate 110 may have the same size and shape. In the embodiment shown in FIGS. 1A and 1B, the surfaces of the bonding pads 130 may be substantially co-planar with the lower surface 114 of the package substrate 110, which in some embodiments may include a solder resist (SR) coating. Alternatively, the surfaces of the bonding pads 130 may be recessed relative to the lower surface 114 of the package substrate 110. In some embodiments, the surfaces of the bonding pads 130 may be raised relative to the lower surface 114 of the package substrate 110.

Referring again to FIGS. 1A and 1B, first solder balls 112 may be provided over the respective conductive bonding pads 130. In one non-limiting example, the conductive bonding pads 130 may have a width dimension that is between about 500 µm and about 550 µm (e.g., ~530 µm), and the first solder balls 112 may have an outer diameter that may be between about 600 µm and about 650 µm (e.g., ~630 µm), although greater and smaller sizes of the first solder balls 112 and/or the bonding pads 130 are within the contemplated scope of disclosure.

A first solder reflow process may include subjecting the package substrate 110 to an elevated temperature (e.g., at least about 250° C.) in order to melt the first solder balls 112 and to cause the first solder balls 112 to adhere to the conductive bonding pads 130. Following the first reflow process, the package substrate 110 may be cooled causing the first solder balls 112 to re-solidify. Following the first solder reflow process, the first solder balls 112 may adhere to the conductive bonding pads 130. Each solder ball 112 may extend from the lower surface 114 of the package substrate 110 by a vertical height that may be less than the outer diameter of the solder ball 112 prior to the first reflow process. For example, where the outer diameter of the solder ball 112 is between about 600 µm and about 650 µm (e.g., ~630 µm), the vertical height of the solder ball 112 following the first reflow process may be between about 500 µm and about 550 µm (e.g., ~520 µm).

In various embodiments, the process of mounting the package substrate 110 onto the support substrate 102 as shown in FIG. 1B, may include aligning the package substrate 110 over the support substrate 102, such that the first solder balls 112 contacting the conductive bonding pads 130 of the package substrate 110 may be located over corresponding bonding pads (e.g., bonding pads 132) on the support substrate 102. A second solder reflow process may then be performed. The second solder reflow process may include subjecting the package substrate 110 to an elevated temperature (e.g., at least about 250° C.) to thereby melt the first solder balls 112 and cause the first solder balls 112 to adhere to the corresponding bonding pads 132 on the support substrate 102. Surface tension may cause the semi-liquid solder to maintain the package substrate 110 in alignment with the support substrate 102 while the solder material cools and solidifies. Upon solidification of the first solder balls 112, the package substrate 110 may sit above the upper surface 116 of the support substrate 102 by a stand-off height that may be between about 0.4 mm to about 0.5 mm, although greater or lesser stand-of heights are within the contemplated scope of disclosure.

Following the mounting of the package substrate 110 to the support substrate 102, a third underfill material portion 134 may be provided in the spaces surrounding the first solder balls 112 and between the lower surface 114 of the package substrate 110 and the upper surface 116 of the first support substrate 102, as is shown in FIG. 1B. In various embodiments, the third underfill material portion 134 may include an epoxy-based material, which may include a composite of resin and filler materials.

Figure 2:
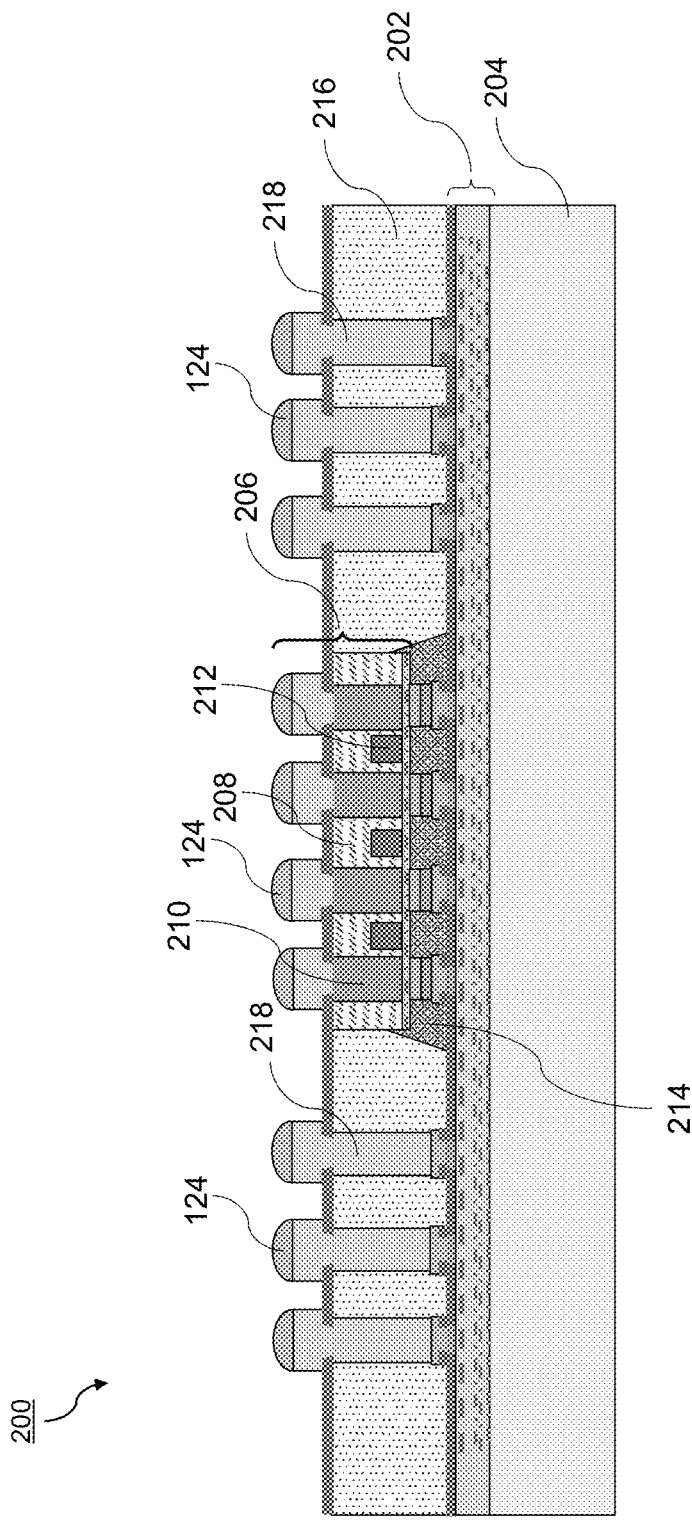
FIG. 2 is a vertical cross-sectional view of a semiconductor device having redistribution layers formed on an active wafer or semiconductor die, according to various embodiments.

FIG. 2 is a vertical cross-sectional view of a semiconductor device 200 having redistribution layers 202 formed directly on an active wafer 204, according to various embodiments. As described in greater detail with reference to FIG. 3, below, the active wafer 204 may include a first semiconductor substrate 302 and a plurality of field-effect transistors 308 formed on or within the first semiconductor substrate 302. The semiconductor device 200 may include one or more redistribution layers 202 formed on a surface of the active wafer 204 and electrically coupled to the plurality of field-effect transistors 308. The semiconductor device 200 may further include an active or passive electrical device 206 electrically coupled to the one or more redistribution layers 202.

The active or passive electrical device 206 may include a silicon substrate 208 and one or more through-silicon-vias 210 formed in the silicon substrate 208. In some embodiments, the active or passive electrical device 206 may be configured as integrated passive device including a deep trench capacitor 212, as shown in FIG. 2. In other embodiments, the active or passive electrical device 206 may be configured as a local silicon interconnect that may provide electrical connections to other electrical components. For example, in some embodiments, the active wafer 204 may be configured as a system-on-chip die (or other semiconductor die), and the active or passive electrical device 206 may be configured as a local silicon interconnect that provides electrical connections between two or more circuit components of the system-on-chip die.

The semiconductor device 200 may include an underfill material 214 formed between a surface of the one or more redistribution layers 202 and a surface of the active or passive electrical device 206. The semiconductor device 200 may further include a molding material matrix 216 formed on a surface of the one or more redistribution layers 202 such that the molding material matrix 216 partially or completely surrounds the active or passive electrical device 206. The molding material matrix 216 may further include one or more through-molding-material vias 218 formed in the molding material matrix 216. The one or more through-molding-material vias 218 may be electrically coupled to the one or more redistribution layers 202.

The one or more through-silicon-vias 210 and the one or more through-molding-material vias 218 may further include a plurality of second metal bumps 124, such as C4 solder bumps. The plurality of second metal bumps 124 may be configured to electrically couple to the semiconductor device 200 to other electrical components. For example, plurality of second metal bumps 124 may be used to electrically couple the semiconductor device 200 to a package substrate 110 (e.g., see FIGS. 1A, 1B, and related description, above). In this way, the semiconductor device 200 of FIG. 2 may take the place of the previously-described structure that includes the first semiconductor device 104 and the second semiconductor device 106 coupled to an interposer 108 (e.g., see FIGS. 1A and 1B).

As described in greater detail, below, the semiconductor device 200 may have advantages over the embodiments described above with reference to FIGS. 1A and 1B. For example, a number of processing steps may be avoided by forming the redistribution layers 202 directly on the active wafer 204 (or semiconductor die) rather than forming a separate interposer 108 that is then attached to the first semiconductor device 104 and the second semiconductor device 106. As such, the process of forming the semiconductor device 200 may be simpler than a comparable process that may be used to form a separate interposer 108. For example, formation of a separate interposer 108 may require the use of one or more carrier substrates to support intermediate structures. In contrast, in the formation of the semiconductor device 200, the active wafer 204 (or semiconductor die), itself, may serve as the only substrate used in forming the semiconductor device. Further, as mentioned above, the semiconductor device 200 may be configured as a modular component that may be attached to a package substrate 110 without an interposer 108. The redistribution layers 202 of the semiconductor device 200 may have a smaller lateral extent than an interposer 108 that may be formed separately. For example, the width of the redistribution layers 202 of the semiconductor device 200 may correspond to a width of a single semiconductor die. This smaller size may further act to reduce or mitigate issues related to thermal expansion stresses that may otherwise exist in a semiconductor package such as the semiconductor package 100 described above with reference to FIGS. 1A and 1B.

Figure 3:
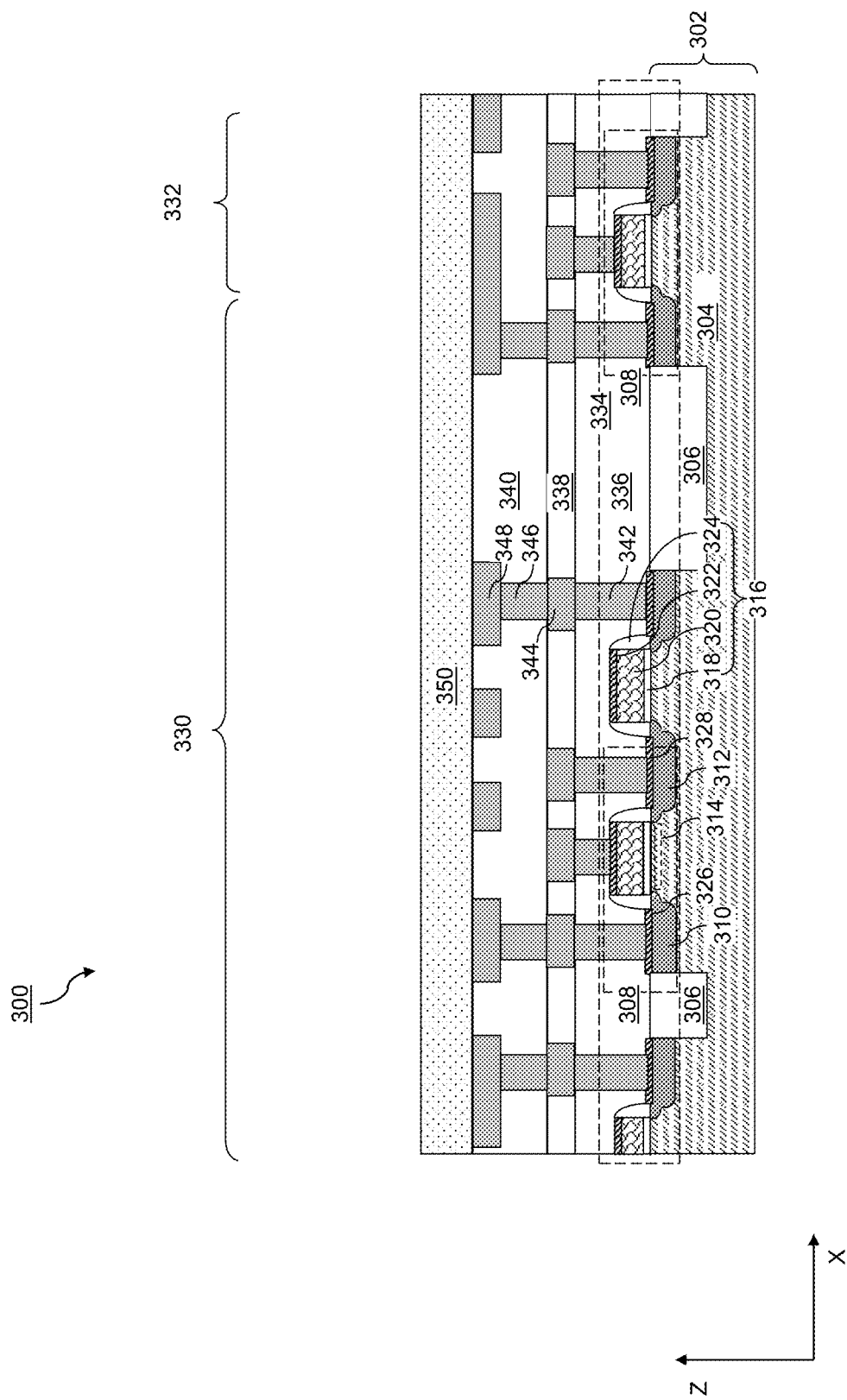
FIG. 3 is a vertical cross-sectional view of an example semiconductor structure after formation of complementary metal-oxide-semiconductor (CMOS) transistors, first metal interconnect structures formed in lower-level dielectric material layers, and an isolation dielectric layer, according to various embodiments.

FIG. 3 illustrates a semiconductor structure 300, according to various embodiments. The semiconductor structure 300 may include a substrate 302, which may be a semiconductor substrate such as a commercially available silicon substrate. The substrate 302 may include a semiconductor material layer 304 or at least at an upper portion thereof. The semiconductor material layer 304 may be a surface portion of a bulk semiconductor substrate or may be a top semiconductor layer of a semiconductor-on-insulator (SOI) substrate. In one embodiment, the semiconductor material layer 304 may include a single crystalline semiconductor material such as single crystalline silicon. In one embodiment, the substrate 302 may include a single crystalline silicon substrate including a single crystalline silicon material.

Shallow trench isolation structures 306 including a dielectric material such as silicon oxide may be formed in an upper portion of the semiconductor material layer 304. Suitably doped semiconductor wells, such as p-type wells and n-type wells, may be formed within each area that is laterally enclosed by a portion of the shallow trench isolation structures 306. Field effect transistors 308 may be formed over a top surface of the semiconductor material layer 304. For example, each of the field effect transistors 308 may include a source electrode 310, a drain electrode 312, a semiconductor channel 314 that may include a surface portion of the substrate 302 extending between the source electrode 310 and the drain electrode 312, and a gate structure 316. The semiconductor channel 314 may include a single crystalline semiconductor material.

Each gate structure 316 may include a gate dielectric layer 318, a gate electrode 320, a gate polycide layer 322, and a dielectric gate spacer 324. A source-side metal-semiconductor alloy region 326 may be formed on each source electrode 310, and a drain-side metal-semiconductor alloy region 328 may be formed on each drain electrode 312. The gate electrode 320 may be formed as a region of heavily doped polysilicon that may have a minimum resistivity of approximately 300 µohm-cm. The resistivity of the gate electrode 320 may be reduced by the formation of the polycide layer 322. Similarly, the resistivity of the doped (p-type or n-type) wells may be reduced by the formation of the source-side metal-semiconductor alloy region 326 and the drain-side metal-semiconductor alloy region 328.

A wide variety of noble and refractory metals may form compounds with silicon (i.e., silicides) and with polysilicon (i.e., polycides) that have reduced specific resistivities. Such silicides/polycides may include $CoSi_2$ (18-25 µohm-cm), $HfSi_2$ (45-50 µohm-cm), $MoSi_2$ (100 µohm-cm), $NiSi_2$ (50-60 µohm-cm), $Pd_2Si$ (30-50 µohm-cm), $PtSi$ (28-35 µohm-cm), $TaSi_2$ (35-55 µohm-cm), $TiSi_2$ (13-25 µohm-cm), $WSi_2$ (70 µohm-cm), and $ZrSi_2$ (35-40 µohm-cm). Other suitable metal-semiconductor compounds within the contemplated scope of disclosure may also be used. The sheet resistance of the gate electrode 320, the source electrode 310, and the drain electrode 312 may be reduced by forming a low-resistivity, shunting silicide/polycide layer (i.e., the gate polycide layer 322, the source-side metal-semiconductor alloy region 326, and the drain-side metal-semiconductor alloy region 328, respectively) on each of their surfaces.

According to an embodiment, the gate polycide layer 322, the source-side metal-semiconductor alloy region 326, and the drain-side metal-semiconductor alloy region 328 may be formed in single "self-aligned silicides" (i.e., "salicide") process. In this regard, after formation of the gate electrode 320 and the doped wells, an oxide may be formed (e.g., by CVD deposition) over the structure and etched (e.g., using a reactive ion etch) to form the dielectric gate spacer 324. In this regard, oxide formed along edges of the gate may be thicker than oxide formed over other regions so that, during an etching process, some oxide may remain on the sides of the gate at the point when the oxide is completely removed from the source electrode 310, the drain electrode 312, and on a top surface of the gate electrode 320. The oxide remaining on the sides of the gate electrode 320 may form the dielectric gate spacer 324. The dielectric gate spacer 324 may be used to prevent silicide/polycide formation on the side of the gate electrode 320 to prevent formation of short-circuit connections between the gate electrode 320 and the source electrode 310 and/or the drain electrode 312.

Metal may be deposited over the structure and a sintering process may be performed to thereby form silicides in regions where the metal touches silicon or polysilicon. Unreacted metal may then be removed with a selective etch that does not attack the silicides/polycides. The resulting silicide/polycide materials may thereby be automatically self-aligned to the gate electrode 320, to the source electrode 310, and to the drain electrode 312. In other words, the gate polycide layer 322 may be aligned with the gate electrode 320, the source-side metal-semiconductor alloy region 326 may be aligned with the source electrode 310, and the drain-side metal-semiconductor alloy region 328 may be aligned with the drain electrode 312.

The devices formed on the top surface of the semiconductor material layer 304 may include complementary metal-oxide-semiconductor (CMOS) transistors and optionally additional semiconductor devices (such as resistors, diodes, capacitors, etc.), and are collectively referred to as CMOS circuitry 334. The semiconductor structure 300 of FIG. 3 may include a memory array region 330 in which an array of memory cells may be subsequently formed. The first exemplary structure may further include a peripheral region 332 in which metal wiring for the array of memory devices is provided. Generally, the field effect transistors 308 in the CMOS circuitry 334 may be electrically connected to an electrode of a respective memory cell by a respective set of metal interconnect structures.

Devices (such as field effect transistors 308) in the peripheral region 332 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry.

One or more of the field effect transistors 308 in the CMOS circuitry 334 may include a semiconductor channel 314 that contains a portion of the semiconductor material layer 304 in the substrate 302. In embodiments in which the semiconductor material layer 304 may include a single crystalline semiconductor material such as single crystalline silicon, the semiconductor channel 314 of each of the field effect transistors 308 in the CMOS circuitry 334 may include a single crystalline semiconductor channel such as a single crystalline silicon channel. In one embodiment, a plurality of field effect transistors 308 in the CMOS circuitry 334 may include a respective node that is subsequently electrically connected to a node of a respective memory cell to be subsequently formed. For example, a plurality of field effect transistors 308 in the CMOS circuitry 334 may include a respective source electrode 310 or a respective drain electrode 312 that is subsequently electrically connected to a node of a respective memory cell to be subsequently formed.

A memory array may be formed as a collection of the field effect transistors 308 in the CMOS circuitry 334 in a FEOL process. Alternatively, a memory array may be formed as a collection of transistors (e.g., thin film transistors including ferroelectric memory cells) to be subsequently formed in an insulating matrix layer 350 in a BEOL process. In one embodiment, the CMOS circuitry 334 may include a programming control circuit configured to control gate voltages of a set of field effect transistors 308 that may be used for programming a respective memory cell and to control gate voltages of transistors (e.g., thin-film transistors) to be subsequently formed.

For example, in a ferroelectric memory array formed over the insulating matrix layer 350, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 302 may include a single crystalline silicon substrate, and the field effect transistors 308 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein and is capable of producing a doped material having electrical conductivity in a range from 1.0 S/cm to $1.0 \times 10^5$ S/cm upon suitable doping with an electrical dopant.

According to an embodiment, the field effect transistors 308 may be subsequently electrically connected to drain electrodes and gate electrodes of access transistors including semiconducting metal oxide plates to be formed above the field effect transistors 308. In one embodiment, a subset of the field effect transistors 308 may be subsequently electrically connected to at least one of the drain electrodes and the gate electrodes. For example, the field effect transistors 308 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 308 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 302 and the semiconductor devices thereupon (such as field effect transistors 308). In an illustrative example, the dielectric material layers may include, for example, a first dielectric material layer 336 that may be a layer that surrounds the contact structure connected to the source and drains (sometimes referred to as a contact-level dielectric material layer), a first interconnect-level dielectric material layer 338, and a second interconnect-level dielectric material layer 340. The metal interconnect structures may include device contact via structures 342 formed in the first dielectric material layer 336 and contact a respective component of the CMOS circuitry 334, first metal line structures 344 formed in the first interconnect-level dielectric material layer 338, first metal via structures 346 formed in a lower portion of the second interconnect-level dielectric material layer 340, and second metal line structures 348 formed in an upper portion of the second interconnect-level dielectric material layer 340.

Each of the dielectric material layers (336, 338, 340) may include a dielectric material such as undoped silicate glass, a doped silicate glass, organosilicate glass, amorphous fluorinated carbon, porous variants thereof, or combinations thereof. Each of the metal interconnect structures (342, 344, 346, 348) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, TiN, alloys thereof, and/or combinations thereof.

Other suitable metallic liner and metallic fill materials within the contemplated scope of disclosure may also be used. In one embodiment, the first metal via structures 346 and the second metal line structures 348 may be formed as integrated line and via structures by a dual damascene process. The dielectric material layers (336, 338, 340) are herein referred to as lower-lower-level dielectric material layers. The metal interconnect structures (342, 344, 346, 348) formed within in the lower-level dielectric material layers are herein referred to as lower-level metal interconnect structures.

While the disclosure is described using an embodiment in which an array of memory cells may be formed over the second line-and-via-level dielectric material layer 340, embodiments are expressly contemplated herein in which the array of memory cells may be formed at a different metal interconnect level.

An array of transistors (e.g., TFTs) and an array of memory cells (e.g., ferroelectric, or other types of memory cells) may be subsequently deposited over the dielectric material layers (336, 338, 340) that have formed therein the metal interconnect structures (342, 344, 346, 348). The set of all dielectric material layer that are formed prior to formation of an array of transistors or an array of memory cells is collectively referred to as lower-level dielectric material layers (336, 338, 340). The set of all metal interconnect structures that is formed within the lower-level dielectric material layers (336, 338, 340) is herein referred to as first metal interconnect structures (342, 344, 346, 348). Generally, first metal interconnect structures (342, 344, 346, 348) formed within at least one lower-level dielectric material layer (336, 338, 340) may be formed over the semiconductor material layer 304 that is located in the substrate 302.

According to an embodiment, transistors may be subsequently formed in a metal interconnect level that overlies that metal interconnect levels that contain the lower-level dielectric material layers (336, 338, 340) and the first metal interconnect structures (342, 344, 346, 348). In one embodiment, a planar dielectric material layer having a uniform thickness may be formed over the lower-level dielectric material layers (336, 338, 340). The planar dielectric material layer is herein referred to as an insulating matrix layer 350. The insulating matrix layer 350 may include a dielectric material such as undoped silicate glass, a doped silicate glass, organosilicate glass, or a porous dielectric material, and may be deposited by chemical vapor deposition. The thickness of the insulating matrix layer 350 may be in a range from 20 nm (i.e., 200 angstrom) to 300 nm (i.e., 3000 angstrom), although lesser and greater thicknesses may also be used.

Generally, interconnect-level dielectric layers (such as the lower-level dielectric material layer (336, 338, 340)) containing therein the metal interconnect structures (such as the first metal interconnect structures (342, 344, 346, 348)) may be formed over semiconductor devices. The insulating matrix layer 350 may be formed over the interconnect-level dielectric layers. Other passive devices may be formed in BEOL processes. For example, various capacitors, inductors, resistors, and integrated passive devices may be utilized with other BEOL devices.

Figure 4:
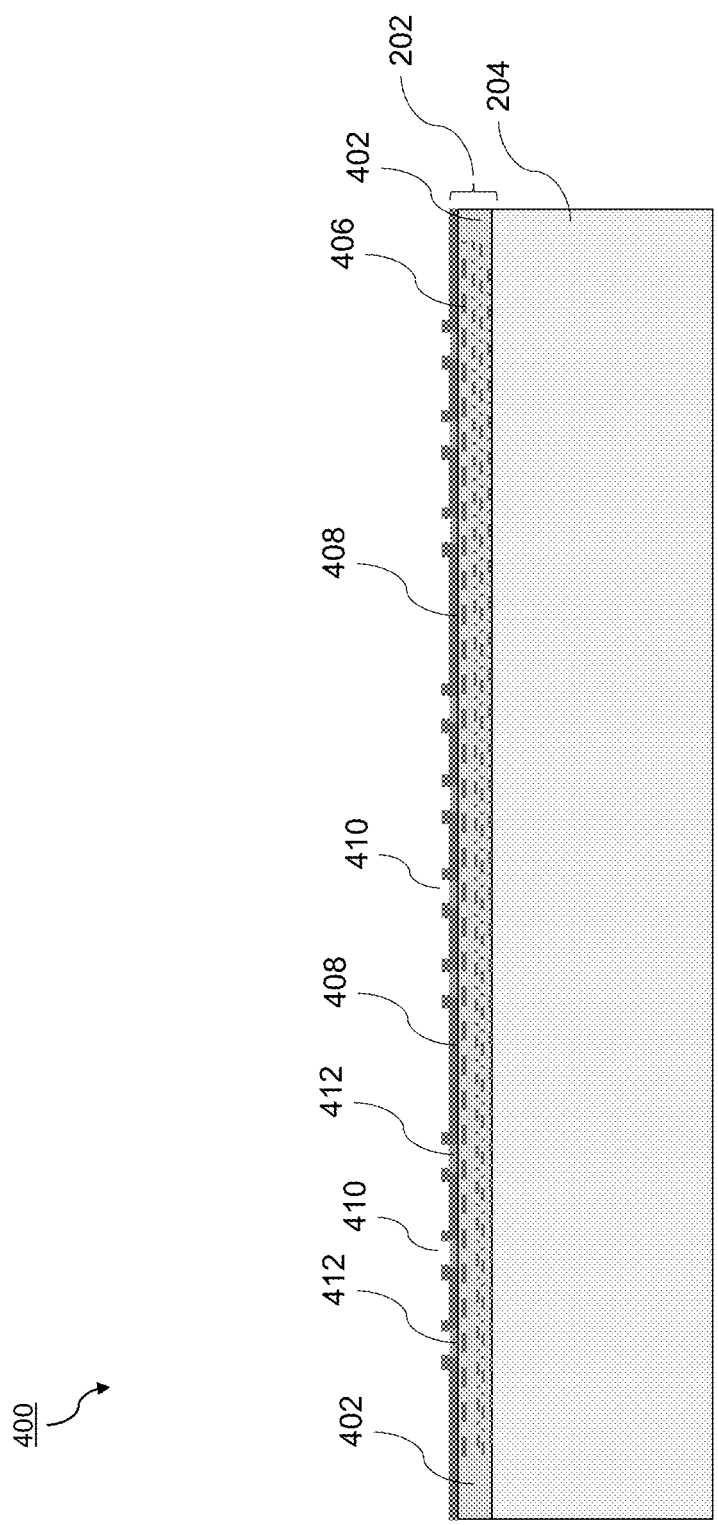
FIG. 4 is a vertical cross-sectional view of an intermediate structure that may be used in the formation of a semiconductor device, according to various embodiments.

FIG. 4 is a vertical cross-sectional view of an intermediate structure 400 that may be used in the formation of a semiconductor device 200, according to various embodiments. As mentioned above with reference to FIG. 2, the intermediate structure 400 may include one or more redistribution layers 202 formed directly on an active wafer 204. The active wafer may include a first semiconductor substrate 302 and a plurality of field-effect transistors 308 formed on or within the first semiconductor substrate 302, as described above with reference to FIG. 3. The active wafer 204 may further include various dielectric material layers (336, 338, 340) and various metal interconnect structures (342, 344, 346, 348) and other structures such as TFTs and memory cells (e.g., see FIG. 3 and related description, above).

In this way, the active wafer 204 may be configured as a complete semiconductor die, such as a system-on-chip die. Alternatively, the active wafer 204 may be an intermediate structure that may require further processing to yield a complete semiconductor device. A top surface of the active wafer 204 may include various electrical connections that may be configured to be electrically coupled to the one or more redistribution layers 202 such that one or more redistribution layers 202 are electrically coupled to devices formed in the active wafer 204 (e.g., such as the field-effect transistors 308, described above with reference to FIG. 3).

The active wafer 204 may have a diameter that may be in a range from 150 mm to 450 mm, although lesser and greater diameters may be used. Alternatively, the active wafer 204 may be provided in a rectangular panel format. In such an alternative embodiment, the dimensions may be substantially the same. The thickness of the active wafer 204 may be in a range from 500 microns to 2,000 microns, although lesser and greater thicknesses may also be used. For example, in an embodiment, the thickness of the active wafer 204 may be 775 microns.

The one or more redistribution layers 202 may be formed over the active wafer 204 and may be formed as a two-dimensional array. Specifically, a redistribution layer 202 may be formed within each of a plurality of unit areas of repetition. Each area of repetition may correspond to an area associated with a semiconductor device 200 (e.g., see FIG. 2) to be individually diced. While FIG. 2 illustrates a region within a unit area, repetition of the structure illustrated in FIG. 2 in two horizontal directions during manufacturing is understood.

Each redistribution layer 202 may include redistribution dielectric layers 402 and redistribution wiring interconnects 406. The redistribution dielectric layers 402 may include a respective dielectric polymer material such as polyimide (PI), benzocyclobutene (BCB), or polybenzobisoxazole (PBO). Each redistribution dielectric layer 402 may be formed by spin coating and drying of the respective dielectric polymer material. The thickness of each redistribution dielectric layer 402 may be in a range from 2 microns to 40 microns, such as from 4 microns to 20 microns. Each redistribution dielectric layer 402 may be patterned, for example, by applying and patterning a respective photoresist layer thereabove, and by transferring the pattern in the photoresist layer into the redistribution dielectric layer 402 using an etch process such as an anisotropic etch process. The photoresist layer may be subsequently removed, for example, by ashing.

Each of the redistribution wiring interconnects 406 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the redistribution wiring interconnects 406 may include copper, nickel, or copper and nickel. The thickness of the metallic fill material that is deposited for each redistribution wiring interconnect 406 may be in a range from 2 microns to 40 microns, such as from 4 microns to 10 microns, although lesser or greater thicknesses may also be used. The total number of levels of wiring in each a redistribution layer 202 (i.e., the levels of the redistribution wiring interconnects 406) may be in a range from 1 to 10.

A top surface of the one or more redistribution layers 202 may include a coating of SR material 408, which may also be referred to as a "solder mask." The coating of SR material 408 (e.g., a polymer material) may provide a protective coating for the one or more redistribution layers 202 and any underlying circuit patterns formed on or within the active wafer 204. An SR material coating may also inhibit solder material from adhering to the top surface of the one or more redistribution layers 202 during a reflow process. The coating of SR material 408 may include a plurality of openings 410 through which bonding pads 412 may be exposed. The bonding pads 412 may be formed in the process used to form the one or more redistribution layers 202, and as such, may be electrically connected to the one or more redistribution layers 202. Additional electrical connections (e.g., bump structures) may then be formed over the bonding pads 412, as described in greater detail with reference to FIG. 5, below.

Figure 5:
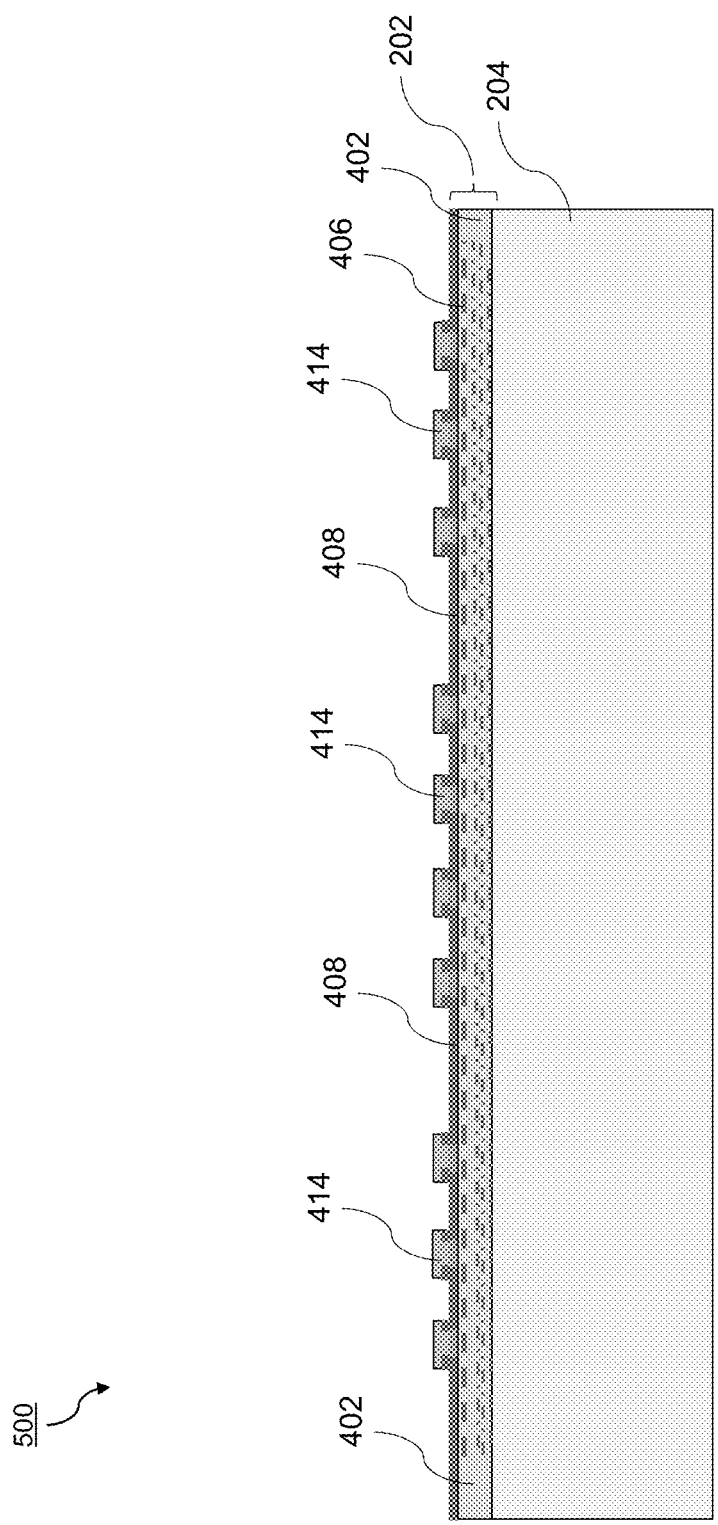
FIG. 5 is a vertical cross-sectional view of a further intermediate structure that may be used in the formation of a semiconductor device, according to various embodiments.

FIG. 5 is a vertical cross-sectional view of a further intermediate structure 500 that may be used in the formation of a semiconductor device 200, according to various embodiments. As shown, the intermediate structure 500 may be formed from the intermediate structure 400 of FIG. 4 by formation of third metal bumps 414. The third metal bumps 414 may be formed as microbump structures. The third metal bumps 414 may be bump structures that may be subsequently used to electrically connect the active or passive electrical device 206 (e.g., local silicon interconnect bridges or integrated passive devices) to be subsequently bonded to a respective one of the one or more redistribution layers 202. A metallic fill material for the third metal bumps 414 may include copper. The third metal bumps 414 may have horizontal cross-sectional shapes of rectangles, rounded rectangles, or circles. Other horizontal cross-sectional shapes may be within the contemplated scope of disclosure. The third metal bumps 414 may be configured for microbump bonding (i.e., C2 bonding), and may have a thickness in a range from 30 microns to 100 microns, although lesser or greater thicknesses may also be used. In one embodiment, the third metal bumps 414 may be formed as an array of microbumps (such as copper pillars) having a lateral dimension in a range from 10 microns to 25 microns and having a pitch in a range from 20 microns to 50 microns.

Figure 6:
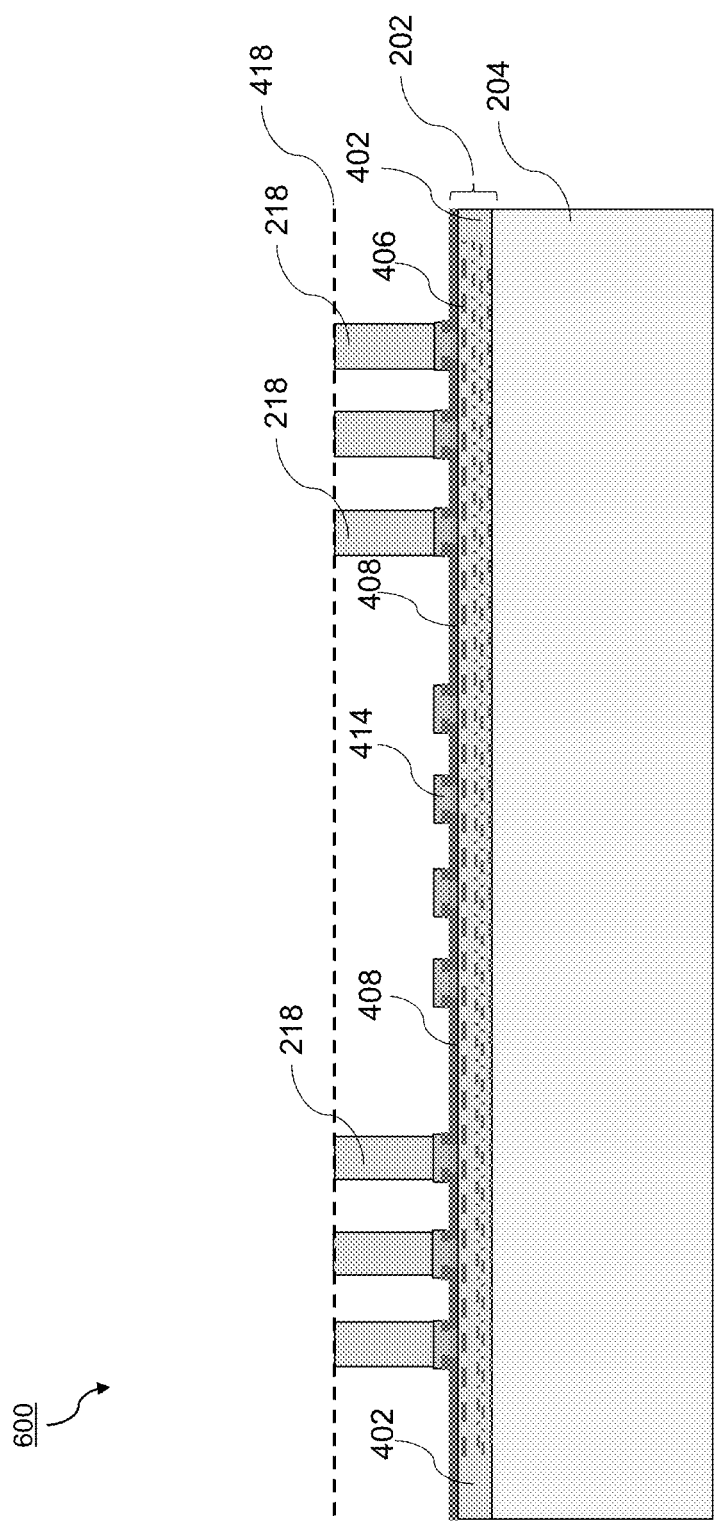
FIG. 6 is a vertical cross-sectional view of a further intermediate structure that may be used in the formation of a semiconductor device, according to various embodiments.

FIG. 6 is a vertical cross-sectional view of a further intermediate structure 600 that may be used in the formation of a semiconductor device 200, according to various embodiments. The intermediate structure 600 may be formed from the intermediate structure 500 of FIG. 5 by forming one or more through-molding-material vias 218. As described with reference to FIG. 2, above, the one or more through-molding-material vias 218 may be configured to extend through the molding material matrix 216 to be subsequently formed. The through-molding-material vias 218 may be formed as follows.

A sacrificial matrix material layer (not shown) may be applied over the one or more redistribution layers 202, and cylindrical cavities may be formed through the sacrificial matrix material layer in, for example, a photolithographic process. The sacrificial matrix material layer may include a polymer material such as polyimide. The pattern of the cylindrical cavities may be arranged around regions in which the active or passive electrical devices 206 are to be subsequently placed. As such, the cylindrical cavities may be formed around regions including a respective array of microbump structures (e.g., third metal bumps 414). Generally, the pattern of the cylindrical cavities may be a periodic pattern that is arranged as a two-dimensional periodic array such as a rectangular array. Each unit pattern within the periodic pattern may have the same area as the area of the semiconductor device 200 to be manufactured. In other words, a two-dimensional array of semiconductor devices 200 may be formed by performing subsequent processing patterns. As such, a unit area that corresponds to the area of a single interposer includes a unit pattern for the cylindrical cavities.

At least one conductive material such as at least one metallic material (such as W, Mo, Ta, Ti, WN, TaN, TiN, etc.) may be deposited in the cylindrical cavities, and excess portions of the at least one conductive material may be removed from above a horizontal plane (indicated by dashed line 418) including the top surface of the sacrificial matrix material layer. Remaining portions of the at least one conductive material include through-molding-material vias 218. The sacrificial matrix material layer may be subsequently removed, for example, by dissolving in a solvent or by ashing. A plurality of active or passive electrical device 206 (e.g., see FIG. 2) may be subsequently attached to the one or more redistribution layers 202, as described in greater detail with reference to FIG. 7, below.

Figure 7:
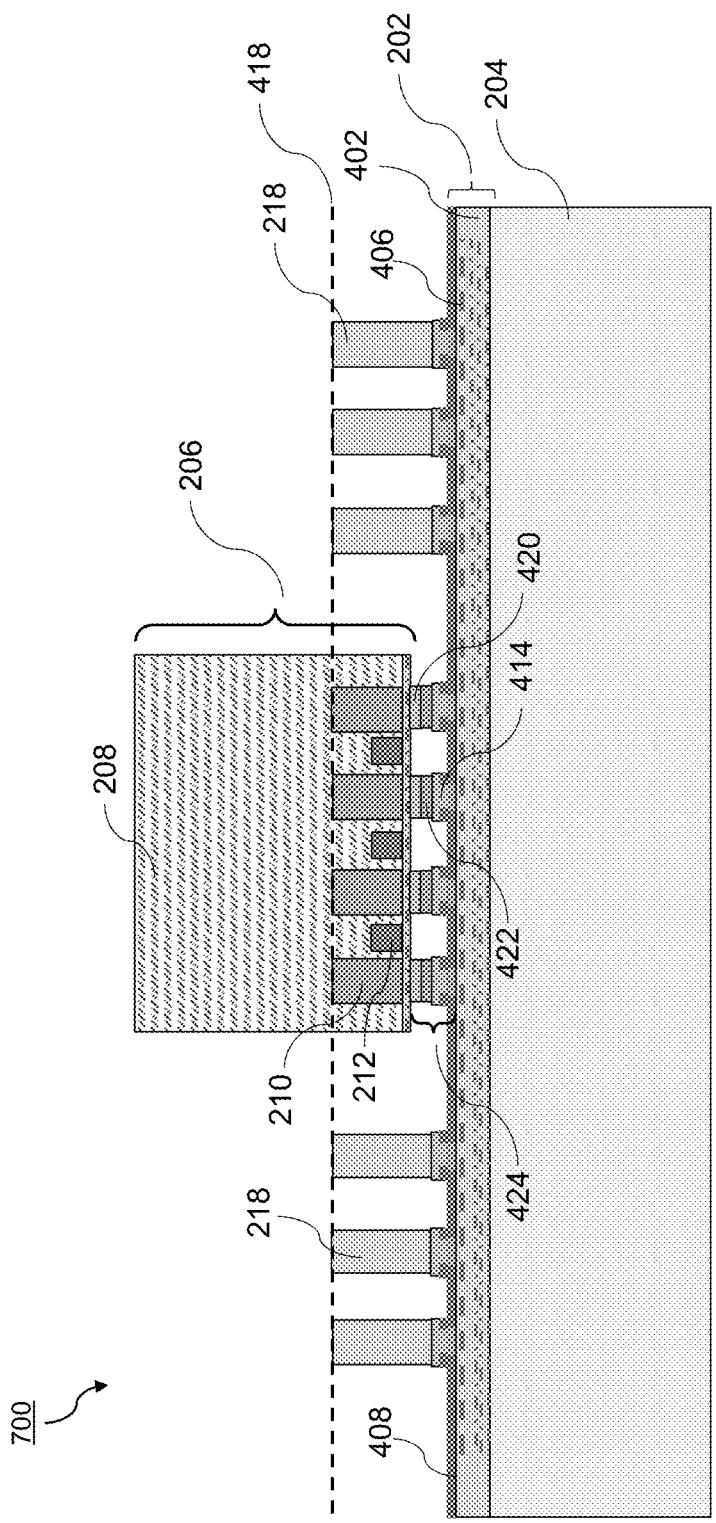
FIG. 7 is a vertical cross-sectional view of a further intermediate structure that may be used in the formation of a semiconductor device, according to various embodiments.

FIG. 7 is a vertical cross-sectional view of a further intermediate structure 700 that may be used in the formation of a semiconductor device 200, according to various embodiments. The intermediate structure 700 may be formed from the intermediate structure 600 of FIG. 6 by attaching an active or passive electrical device 206 to the intermediate structure 600. As shown, the active or passive electrical device 206 may be attached in an area not occupied by the through-molding-material vias 218.

In this example embodiment, the active or passive electrical device 206 may be an integrated passive device having one or more deep trench capacitors 212. However, as described in greater detail, below (e.g., see FIGS. 19, 20A, and 20B and related description), various other types of active or passive devices 206 may be used in other embodiments. For example, the active or passive electrical device 206 may a local silicon interconnect bridge die 1900 (e.g., see FIG. 19).

Microbump structures 420 on the active or passive electrical device 206 may be bonded to the third metal bumps 414 on the redistribution layers 202 using arrays of solder material portions 422. Each bonded combination of a microbump structure (e.g., third metal bumps 414) on the active or passive electrical device 206, a microbump structure 420 on a redistribution layer 202, and a solder material portion 422 is herein referred to as a microbump bonding structure 424. Generally, the active or passive electrical device 206 may be bonded to the redistribution layers 202 using arrays of microbump bonding structures 424.

Figure 8:
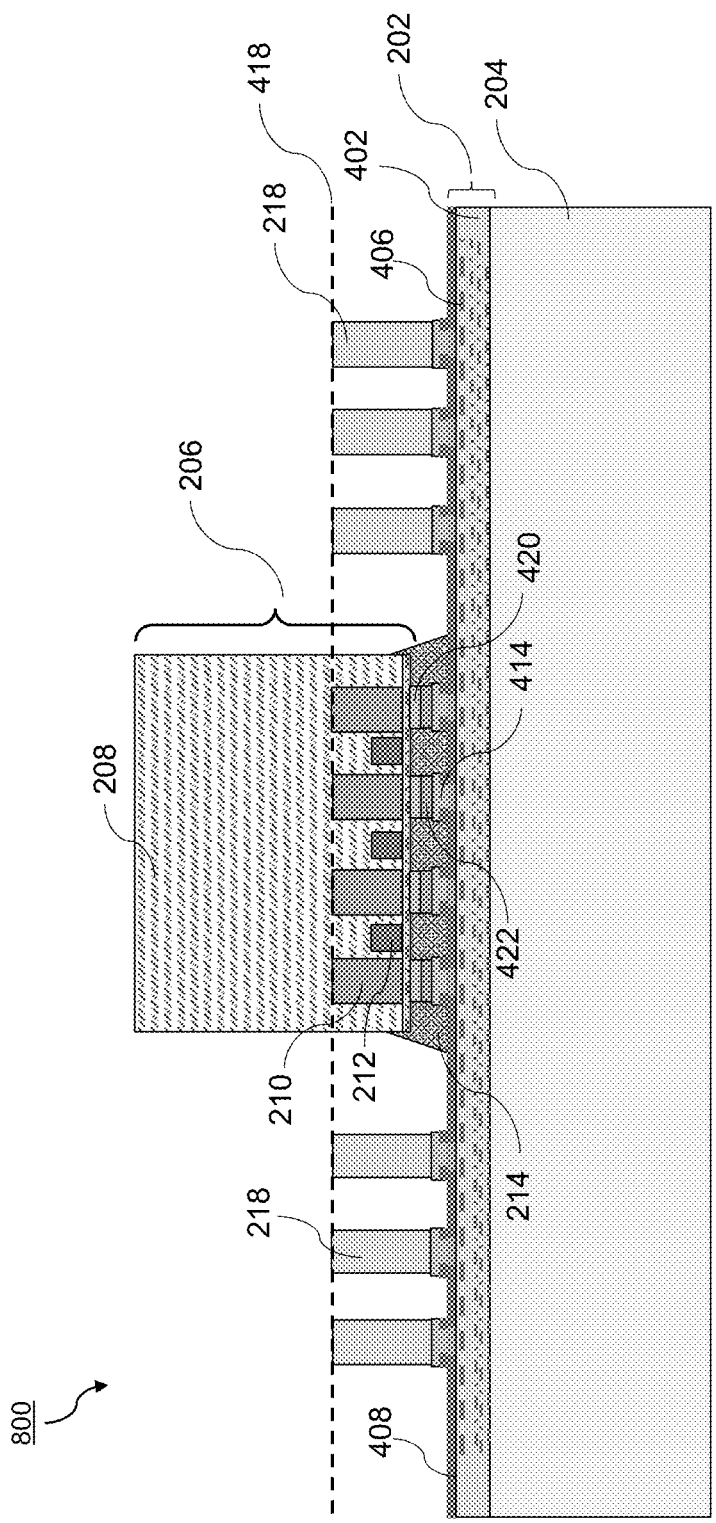
FIG. 8 is a vertical cross-sectional view of a further intermediate structure that may be used in the formation of a semiconductor device, according to various embodiments.

FIG. 8 is a vertical cross-sectional view of a further intermediate structure 800 that may be used in the formation of a semiconductor device 200, according to various embodiments. The intermediate structure 800 may be formed from the intermediate structure 700 of FIG. 7 by forming a fourth underfill material portion 214 in spaces surrounding the microbump bonding structures 424 (e.g., see FIG. 7) and between a lower surface of the active or passive electrical device 206 and a surface of the redistribution layers 202. In various embodiments, the fourth underfill material portion 214 may include an epoxy-based material, which may include a composite of resin and filler materials.

Figure 9:
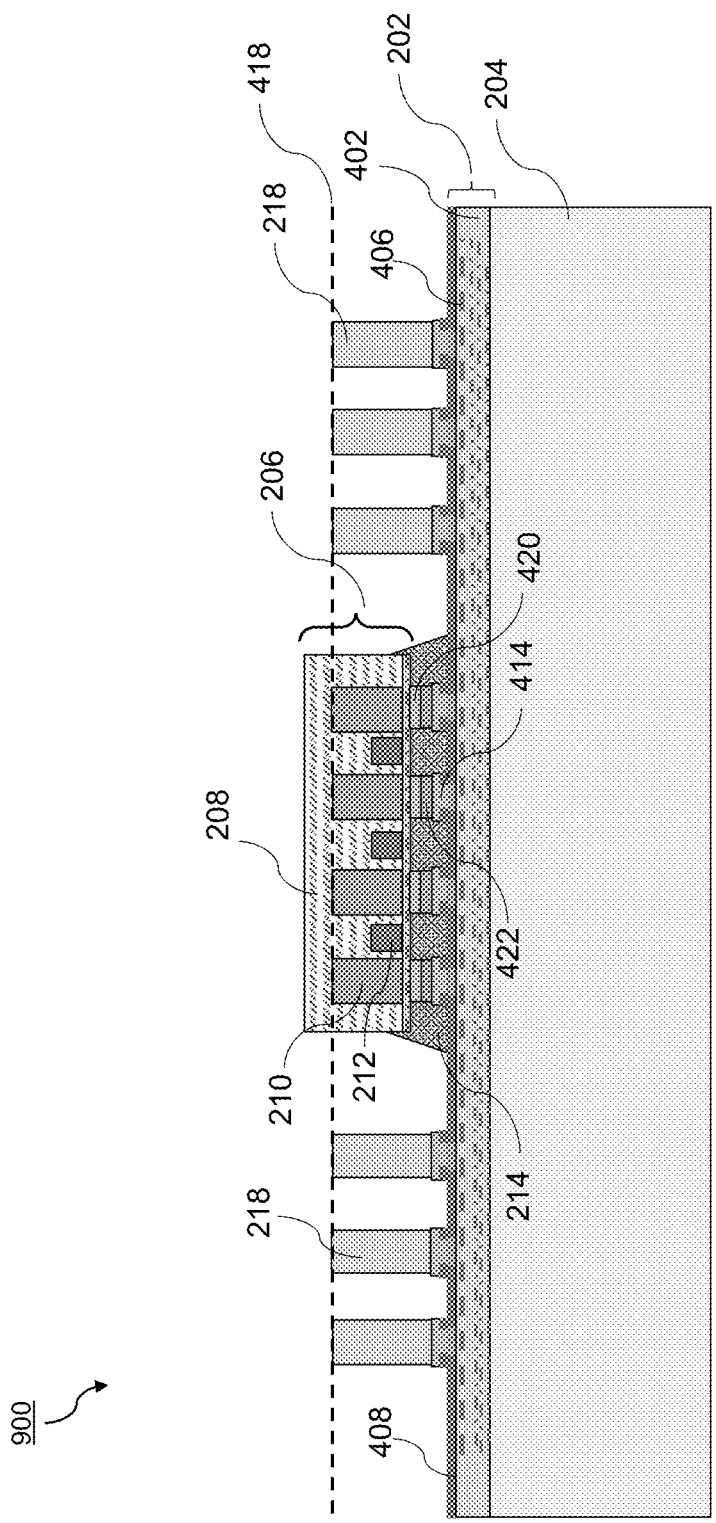
FIG. 9 is a vertical cross-sectional view of a further intermediate structure that may be used in the formation of a semiconductor device, according to various embodiments.

FIG. 9 is a vertical cross-sectional view of a further intermediate structure 900 that may be used in the formation of a semiconductor device 200, according to various embodiments. The intermediate structure 900 may be formed from the intermediate structure 800 of FIG. 8 by removing a top portion of the silicon substrate 208 of the active or passive electrical device 206. As shown, a height of the active or passive electrical device 206 may be reduced by removing the portion of the silicon substrate 208 such that the height of the active or passive electrical device 206 is just above a height of the through-molding-material vias 218 (as indicated by the dashed line 418). The portion of the silicon substrate 208 may be removed, for example, by backside grinding. Optionally, at least one selective etch process (such as a wet etch process or a reactive ion etch process) may be used in conjunction with the backside grinding process to minimize collateral removal of surface portions of the redistribution layers 202. In this regard, the presence of the SR material 408 may act to protect the redistribution layers 202 during the process of removing the portion of the silicon substrate 208.

Figure 10:
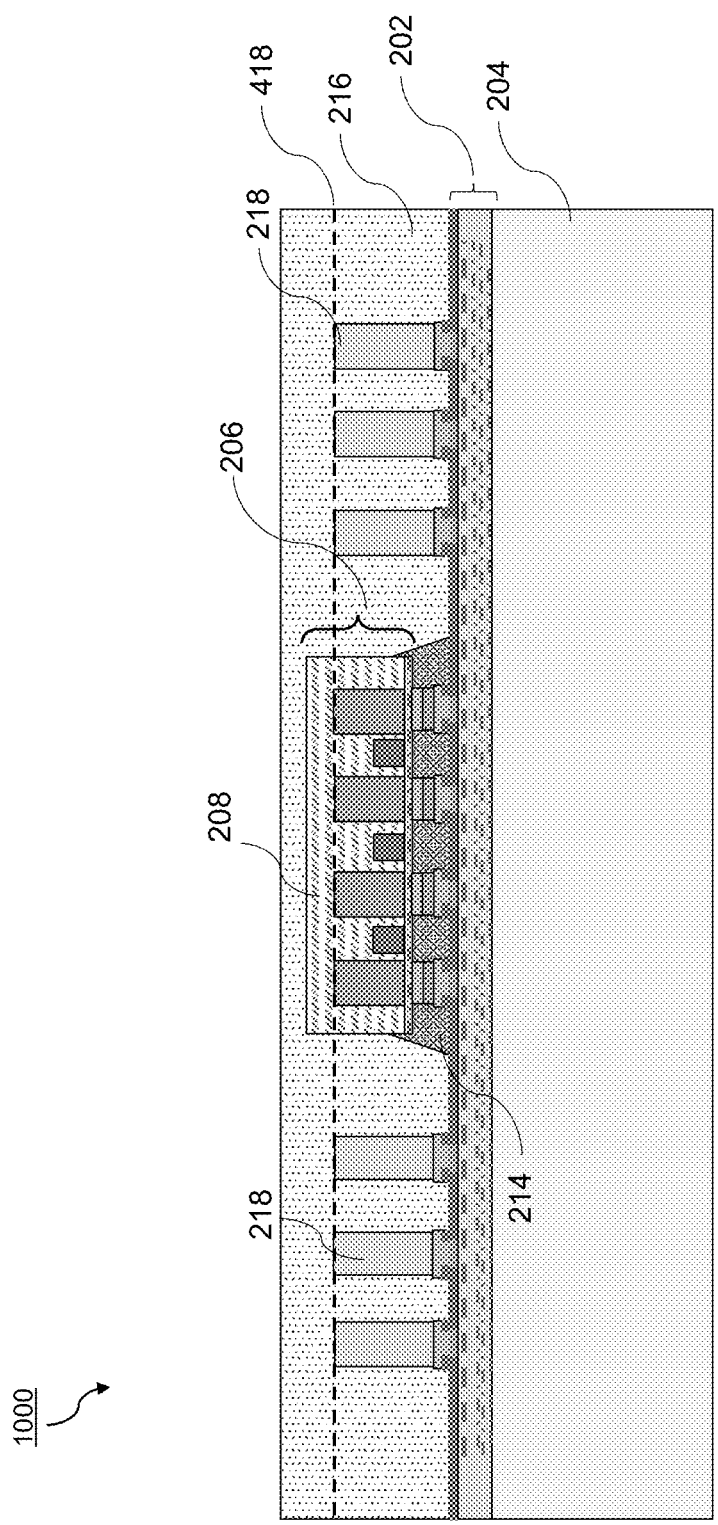
FIG. 10 is a vertical cross-sectional view of a further intermediate structure that may be used in the formation of a semiconductor device, according to various embodiments.

FIG. 10 is a vertical cross-sectional view of a further intermediate structure 1000 that may be used in the formation of a semiconductor device 200, according to various embodiments. The intermediate structure 1000 may be formed from the intermediate structure 900 of FIG. 9 by forming an encapsulant, such as a molding material to form a molding material matrix 216. The molding material may be applied to gaps between the active or passive electrical device 206 and the through-molding-material vias 218. The molding material may include an epoxy-containing compound that may be hardened (i.e., cured) to provide a dielectric material portion having sufficient stiffness and mechanical strength. The molding material may include epoxy resin, hardener, silica (as a filler material), and other additives. The molding material may be provided in a liquid form or in a solid form depending on the viscosity and flowability. Liquid molding material typically provides better handling, good flowability, less voids, better fill, and less flow marks. Solid molding material typically may provide less cure shrinkage, better stand-off, and less die drift. A high filler content (such as 85% in weight) within a molding material may shorten the time in mold, lower the mold shrinkage, and reduce the mold warpage. Uniform filler size distribution in the molding material may reduce flow marks and may enhance flow ability.

The molding material may be cured at a curing temperature to form the molding material matrix 216 (e.g., see FIG. 2 and related description, above). In embodiments in which an underfill material 214 is used to laterally surround the array of microbump bonding structures 424, such underfill material 214 portions may be incorporated into the first molding material matrix 216. The first molding material matrix 216 may laterally enclose each of the active or passive electrical device 206 and the through-molding-material vias 218. The first molding material matrix 216 may be a continuous material layer that extends across the entirety of the area of the active wafer 204. As such, the first molding material matrix 216 may include a plurality of molding material matrix 216 frames that are laterally adjoined to one another. Each molding material matrix 216 frame may correspond to a portion of the first molding material matrix 216 located within a unit area (i.e., an area of a single semiconductor device 200) to be subsequently formed. Each molding material matrix 216 frame may be located within a respective unit area and may laterally surround a respective set of at least one active or passive electrical device 206 and a respective array of through-molding-material vias 218.

Figure 11:
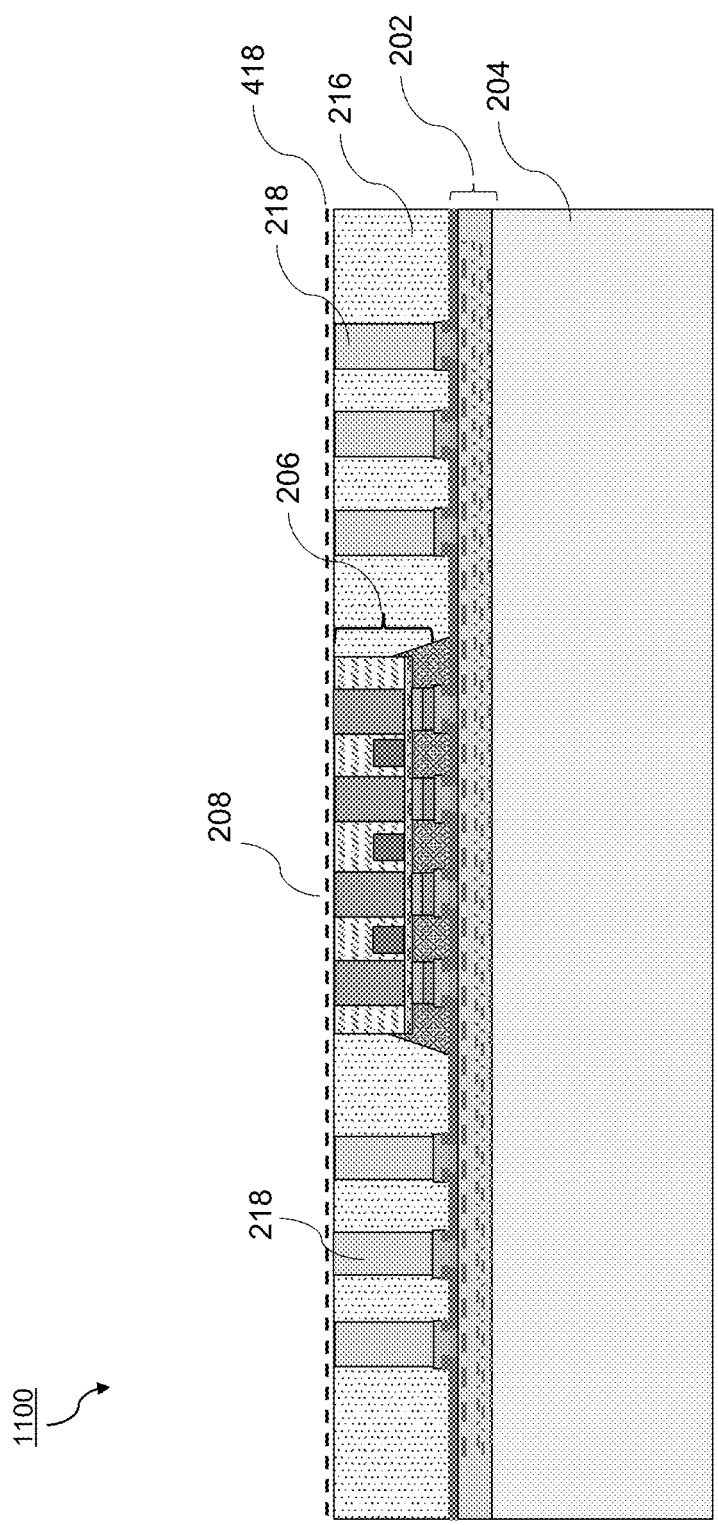
FIG. 11 is a vertical cross-sectional view of a further intermediate structure that may be used in the formation of a semiconductor device, according to various embodiments.

FIG. 11 is a vertical cross-sectional view of a further intermediate structure 1100 that may be used in the formation of a semiconductor device 200, according to various embodiments. The intermediate structure 1100 may be formed from the intermediate structure 1000 of FIG. 11 by removing excess portions first molding material matrix 216. Such excess portions of the first molding material matrix 216 may be removed from above a horizontal plane (e.g., as indicated by the dashed line 418) by a planarization process, which may use chemical mechanical planarization (CMP). The horizontal plane may correspond to top surfaces of the one or more active or passive devices 206 and a respective array of through-molding-material vias 218. The planarization process may cause top surfaces of the through-molding-material vias 218 to become exposed.

Figure 12:
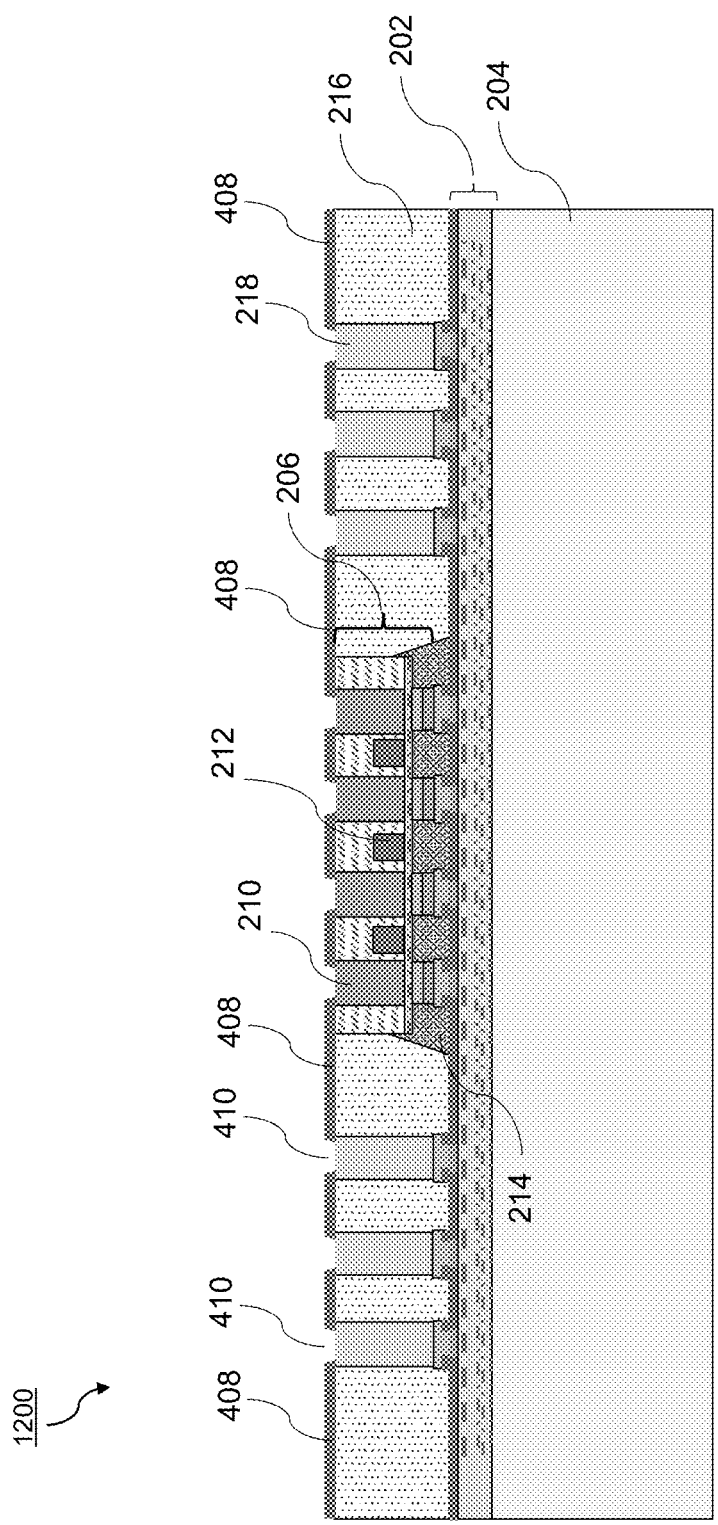
FIG. 12 is a vertical cross-sectional view of a further intermediate structure that may be used in the formation of a semiconductor device, according to various embodiments.

FIG. 12 is a vertical cross-sectional view of a further intermediate structure 1200 that may be used in the formation of a semiconductor device 200, according to various embodiments. The intermediate structure 1200 may be formed from the intermediate structure 1100 of FIG. 11 by formation of a solder mask, which may include a coating of SR material 408, over the intermediate structure 1100. As shown, the solder mask 408 may include openings 410 through which top surfaces of the through-silicon-vias 210 and the through-molding-material vias 218 may be exposed.

The coating of SR material 408 may be provided in the form of a liquid polymer that may be formed over a top surface of the intermediate structure 1100 of FIG. 11. The SR material 408 may be a liquid epoxy material that may be deposited using an inkjet printing or silk-screening process. Alternatively, the SR material 408 may be a liquid photo-imageable material that may be applied to the top surface of the intermediate structure 1100. Photolithography techniques may then be used to generate openings 410 in the solder mask. In other embodiments, a patterned mask (e.g., a patterned photoresist) may be formed over the intermediate structure 1100 of FIG. 11 to cover top surfaces of the through-silicon-vias 210 and the through-molding-material vias 218. The coating of SR material 408 may then be deposited in areas not covered by the patterned mask. SR material 408 may then be cured to form the solder mask. The patterned mask may then be removed using a chemical solvent or by ashing, thereby leaving the openings 410. Additional electrical connections (e.g., bump structures) may then be formed over the top surfaces of the through-silicon-vias 210 and the through-molding-material vias 218, as described in greater detail with reference to FIG. 13, below.

Figure 13:
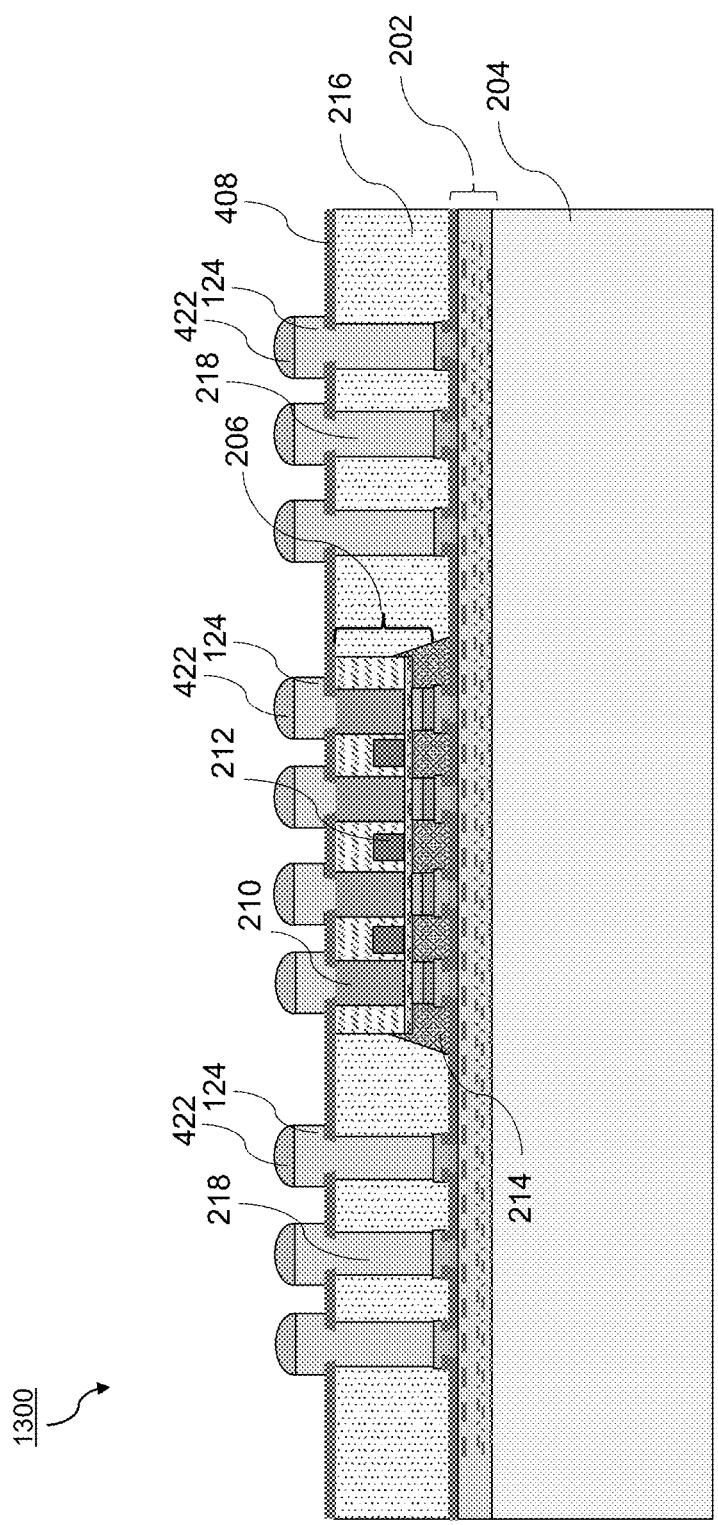
FIG. 13 is a vertical cross-sectional view of a further intermediate structure that may be used in the formation of a semiconductor device, according to various embodiments.

FIG. 13 is a vertical cross-sectional view of a further intermediate structure 1300 that may be used in the formation of a semiconductor device 200, according to various embodiments. The intermediate structure 1300 may be formed from the intermediate structure 1200 of FIG. 12 by forming a plurality of second metal bumps 124 over top surfaces of the through-silicon-vias 210 and the through-molding-material vias 218. In various embodiments, the second metal bumps 124 may include solder material portions 422 that may be configured as C4 solder bumps. The second metal bumps 124 and solder material portions 422 may be configured to form an electrical connection with the through-silicon-vias 210 and the through-molding-material vias 218. As such, the second metal bumps 124 may be configured to connect the semiconductor device 200 (e.g., see FIG. 2) to a package substrate 110 (e.g., see FIGS. 1A and 1B). In this way, the through-silicon-vias 210 and the through-molding-material vias 218 may be configured to form electrical connections with electrical interconnect structures within a package substrate 110. In various embodiments, the second metal bumps 124 may include a suitable solder material, such as tin (Sn), although other suitable solder materials are within the contemplated scope of disclosure.

Figure 14:
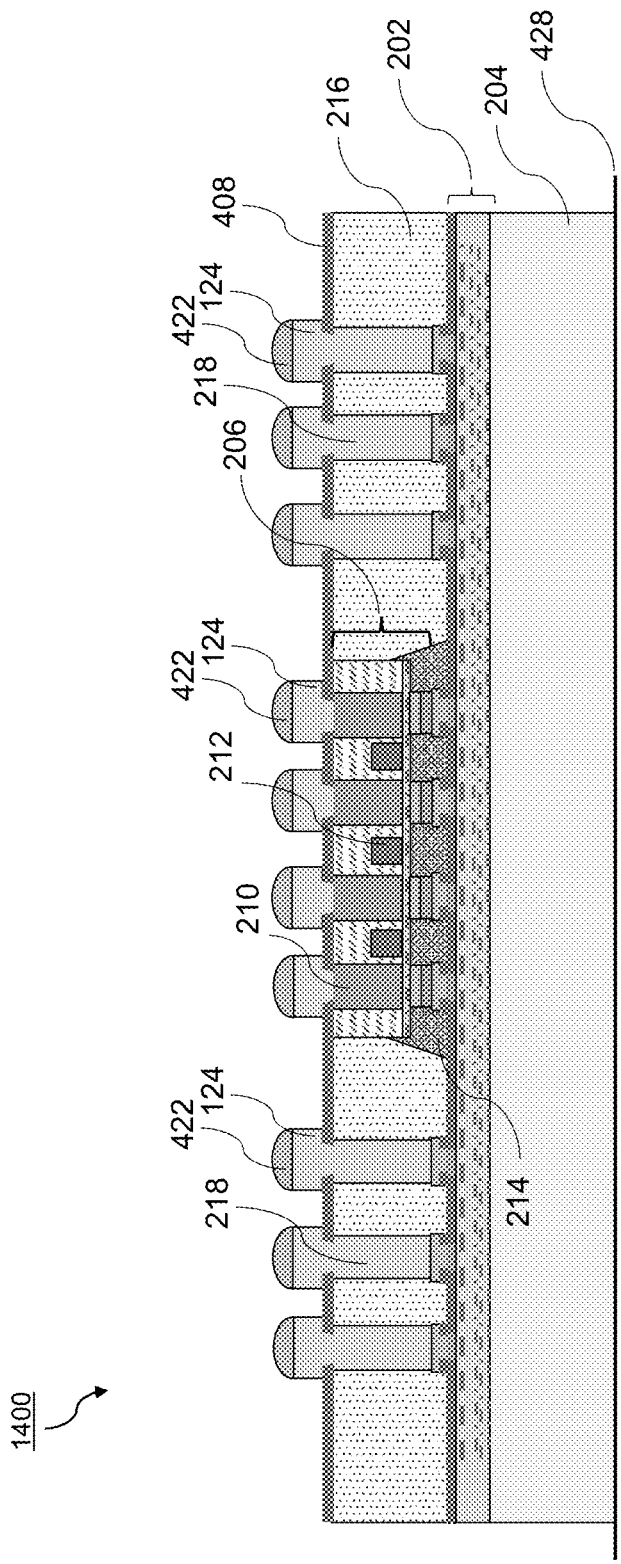
FIG. 14 is a vertical cross-sectional view of a further intermediate structure that may be used in the formation of a semiconductor device, according to various embodiments.

FIG. 14 is a vertical cross-sectional view of a further intermediate structure 1400 that may be used in the formation of a semiconductor device 200, according to various embodiments. The intermediate structure 1400 may be formed from the intermediate structure 1300 by removing a lower portion of the active wafer 204 and mounting the resulting structure on a dicing frame 428. The lower portion of the active wafer 204 that is removed may be a portion of the semiconductor substrate 302 that does not include semiconductor devices, dielectric layers, or interconnect structures.

The lower portion of the active wafer 204 may be removed by, for example, by backside grinding. Optionally, at least one selective etch process (such as a wet etch process or a reactive ion etch process) may be used in conjunction with the backside grinding process to minimize collateral removal of other portions of the intermediate structure 1300. The active wafer 204 may have a starting thickness in a range between 500 microns and 1000 microns. After the portion of the active wafer 204 is removed, the active wafer 204 may have a final thickness in a range from 200 microns to 500 microns. For example, in an embodiment, the active wafer 204 may have a starting thickness of approximately 775 microns and a final thickness of approximately 400 microns.

The dicing frame 428 may be mounted to lower surface of the active wafer 204 after the portion of the active wafer 204 has been removed, as shown in FIG. 14. The dicing frame 428 may be mounted to the lower surface of the active wafer 204 using an adhesive layer (not shown). For example, a first side of a double-sided adhesive tape or film may be applied to the lower side of the active wafer 204 to thereby attach the active wafer 204 to the first side of the adhesive tape or film. A second side of the adhesive tape or film may then be applied to a surface of the dicing frame 428 to thereby attach the active wafer 204 to the dicing frame 428. The intermediate structure 1400 of FIG. 14 may then be singulated to generate a plurality of semiconductor devices 200 (see e.g., FIG. 2). The view of FIG. 14 corresponds to a single unit area of active wafer 204. The intermediate structure 1400 therefore corresponds to a portion of the active wafer 204, that when singulated, generates a single semiconductor device 200. It is to be understood, however, that a plurality of structures corresponding to the intermediate structure 1400 may be formed on a single active wafer 204. As such, a corresponding plurality of semiconductor structures 200 may be generated by singulating the active wafer 204.

FIGS. 15 to 18 are vertical cross-sectional views of respective intermediate structures 1500 to 1800 that may be used in the formation of an active or passive electrical device 206 (e.g., see FIG. 2 and related description, above), according to various embodiments. The intermediate structure 1500 shows two unit areas 1502*a* and 1502*b* (i.e., areas of repetition) on a semiconductor substrate, which may be a silicon substrate 208. A plurality of through-silicon-vias 210 and deep trench capacitors 212 may be formed on a top surface of the silicon substrate 208. Although only two unit areas 1502*a* and 1502*b* are shown in FIG. 15, it is to be understood that the silicon substrate 208 may include a plurality of unit areas that may be used to form a corresponding plurality of active or passive devices 206. In this example, the active or passive devices 206 to be formed may be configured as an integrated passive device containing deep trench capacitors 212.

Each of the through-silicon-vias 210 may be formed by forming a plurality of cavities in the top surface of the silicon substrate 208. The cavities may then be filled with a metallic material to thereby form the through-silicon-vias 210. The cavities may be formed by forming a patterned mask (not shown) over the silicon substrate 208 followed by etching the silicon substrate 208. The patterned mask may be a photoresist that may be patterned to have openings corresponding to locations where cavities are to be formed. The cavities may then be formed by performing an anisotropic etch to remove portions of the silicon substrate 208 to thereby generate the cavities. At least one conductive material such as W, Mo, Ta, Ti, WN, TaN, TiN, etc. may then be deposited in the cavities. Excess portions of the at least one conductive material may be removed from above a top surface of the silicon substrate 208.

Deep trench capacitors 212 may be formed by forming cavities in the silicon substrate 208 and by forming a multi-layer structure in the cavities. The multi-layer structure may include one or more dielectric layers sandwiched between conductive layers (not shown). The cavities may be formed by etching the silicon substrate 208 as described above with reference to the formation of the through-silicon-vias 210. In this regard, a patterned mask may be formed over a surface of the silicon substrate 208 and the previously-formed through-silicon-vias 210. Cavities may then be formed by etching the silicon substrate 208 in regions that are not masked by the patterned mask. The patterned mask may be a photoresist that may be patterned using photolithography techniques. After etching the silicon substrate 208 to form cavities, the multi-layer structure may be formed by deposition of a conducting layer, followed by deposition of an insulating layer, followed by a further conducting layer. In other embodiments, the multi-layer structure may have greater numbers of conducting and insulating layers.

A first conductive layer (not shown) may be formed by depositing a conductive metallic nitride or a conductive metallic carbide such as TiN, TaN, WN, TiC, TaC, and/or WC. Other suitable conductive materials within the contemplated scope of this disclosure may also be used. The first electrically conductive layer may be deposited so as to form a first electrically conductive contact of the deep trench capacitor. A dielectric layer may then be deposited over the first conductive layer. According to an embodiment, the dielectric layer may be conformally deposited and may include a high-k dielectric material. Examples of high-k dielectric materials include, but are not limited to, hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, and hafnium dioxide-alumina (HfO2-Al2O3). Other suitable dielectric materials are within the contemplated scope of disclosure. In various embodiments, the high-k dielectric layer may have a thickness in the range of 0.5-5.0 nm, such as 1-4 nm, although greater or lesser thicknesses may be used. A second conducting layer may then be deposited over the dielectric layer. Additional conducting and dielectric layers may be formed in other embodiments. Remaining portions of the conducting and dielectric layers may be removed from a surface of the silicon substrate 208 along with the patterned mask.

FIG. 16 is a vertical cross-sectional view of a further intermediate structure 1600 that may be used in the formation of an active or passive electrical device 206, according to various embodiments. The intermediate structure 1600 may be formed from the intermediate structure 1500 by the formation of one or more metal routing layers 430 over the top surface of the intermediate structure 1500. The one or more metal routing layers 430 may be formed as a two-dimensional array. Specifically, a metal routing layer 430 may be formed within each of a plurality of unit areas (1502*a*, 1502*b*) of repetition.

Each metal routing layer 430 may include redistribution dielectric layers 402 and redistribution wiring interconnects 406 (e.g., see FIG. 4 and related description, above). The redistribution dielectric layers 402 may include a respective dielectric polymer material such as polyimide (PI), benzocyclobutene (BCB), or polybenzobisoxazole (PBO). Each redistribution dielectric layer 402 may be formed by spin coating and drying of the respective dielectric polymer material. The thickness of each redistribution dielectric layer 402 may be in a range from 2 microns to 40 microns, such as from 4 microns to 20 microns. Each redistribution dielectric layer 402 may be patterned, for example, by applying and patterning a respective photoresist layer thereabove, and by transferring the pattern in the photoresist layer into the redistribution dielectric layer 402 using an etch process such as an anisotropic etch process. The photoresist layer may be subsequently removed, for example, by ashing.

Each of the redistribution wiring interconnects 406 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the redistribution wiring interconnects 406 may include copper, nickel, or copper and nickel. The thickness of the metallic fill material that is deposited for each redistribution wiring interconnect 406 may be in a range from 2 microns to 40 microns, such as from 4 microns to 10 microns, although lesser or greater thicknesses may also be used. The total number of levels of wiring in each a metal routing layer 430 (i.e., the levels of the redistribution wiring interconnects 406) may be in a range from 1 to 10.

Figure 17:
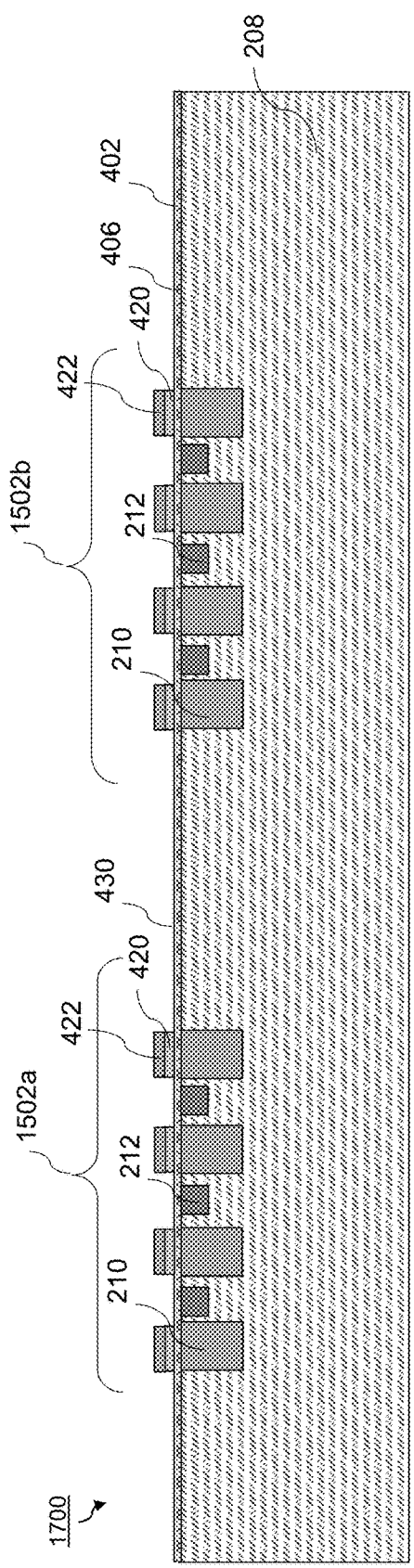
FIG. 17 is a vertical cross-sectional view of a further intermediate structure that may be used in the formation of an active or passive device, according to various embodiments.

FIG. 17 is a vertical cross-sectional view of a further intermediate structure 1700 that may be used in the formation of an active or passive electrical device 206, according to various embodiments. As shown, the intermediate structure 1700 may be formed from the intermediate structure 1600 of FIG. 16 by formation of microbump structures 420. The microbump structures 420 may be bump structures that may be subsequently used to electrically connect the active or passive electrical device 206 to other components (e.g., see FIG. 7 and related description). A metallic fill material for the microbump structures 420 may include copper. The microbump structures 420 may have horizontal cross-sectional shapes of rectangles, rounded rectangles, or circles. Other horizontal cross-sectional shapes may be within the contemplated scope of disclosure. The microbump structures 420 may be configured for microbump bonding (i.e., C2 bonding), and may have a thickness in a range from 30 microns to 100 microns, although lesser or greater thicknesses may also be used. In one embodiment, the microbump structures 420 may be formed as an array of microbumps (such as copper pillars) having a lateral dimension in a range from 10 microns to 25 microns and having a pitch in a range from 20 microns to 50 microns.

Figure 18:
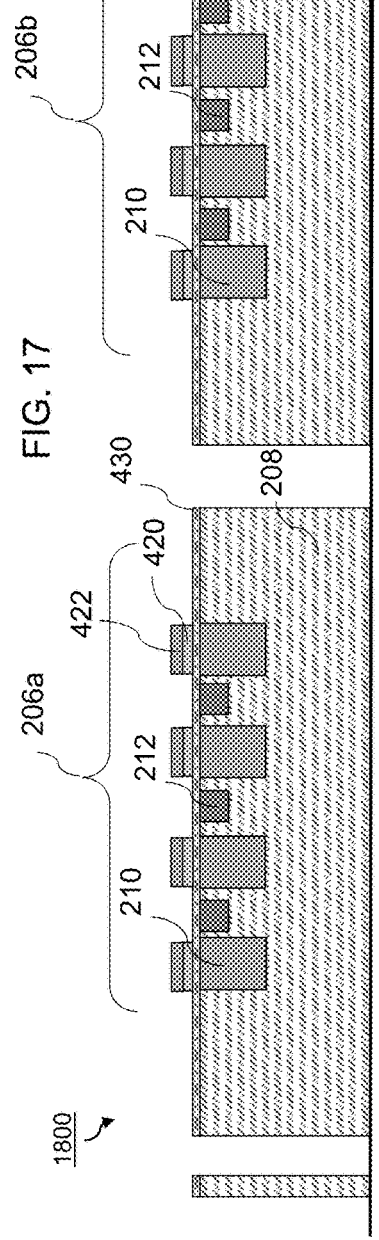
FIG. 18 is a vertical cross-sectional view of a further intermediate structure that may be used in the formation of an active or passive device, according to various embodiments.

FIG. 18 is a vertical cross-sectional view of a further intermediate structure 1800 that may be used in the formation of an active or passive electrical device 206, according to various embodiments. The intermediate structure 1800 may be formed from the intermediate structure 1700 by removing a lower portion of the silicon substrate 208, mounting the resulting structure on a dicing frame 428, and dicing the structure to form active or passive electrical devices 206a and 206b.

The lower portion of the silicon substrate 208 may be removed by, for example, by backside grinding. Optionally, at least one selective etch process (such as a wet etch process or a reactive ion etch process) may be used in conjunction with the backside grinding process to minimize collateral removal of other portions of the intermediate structure 1700. The silicon substrate 208 may have a starting thickness in a range between 500 microns and 1000 microns. After the portion of the silicon substrate 208 is removed, the silicon substrate 208 may have a final thickness in a range from 200 microns to 500 microns. For example, in an embodiment, the active wafer may have a starting thickness of approximately 775 microns and a final thickness of approximately 400 microns.

The dicing frame 428 may be mounted to lower surface of the silicon substrate 208 after the portion of the silicon substrate 208 has been removed, as shown in FIG. 18. The dicing frame 428 may be mounted to the lower surface of the silicon substrate 208 using an adhesive layer (not shown). For example, a first side of a double-sided adhesive tape or film may be applied to the lower side of the silicon substrate 208 to thereby attach the silicon substrate 208 to the first side of the adhesive tape or film. A second side of the adhesive tape or film may then be applied to a surface of the dicing frame 428 to thereby attach the silicon substrate 208 to the dicing frame 428. The intermediate structure 1800 of FIG. 18 may then be singulated to generate a plurality of active or passive devices (206a, 206b).

The view of FIG. 17 corresponds to two unit areas (1502a, 1502b) of the silicon substrate 208. The intermediate structure 1700 therefore corresponds to a portion of the silicon substrate 208, which when singulated, generates two active or passive devices (206a, 206b), as shown in FIG. 18. It is to be understood, however, that a plurality of structures corresponding to the intermediate structure 1700 may be formed on a single silicon substrate 208. As such, a corresponding plurality of active or passive devices 206 may be generated by singulating the silicon substrate 208.

Figure 19:
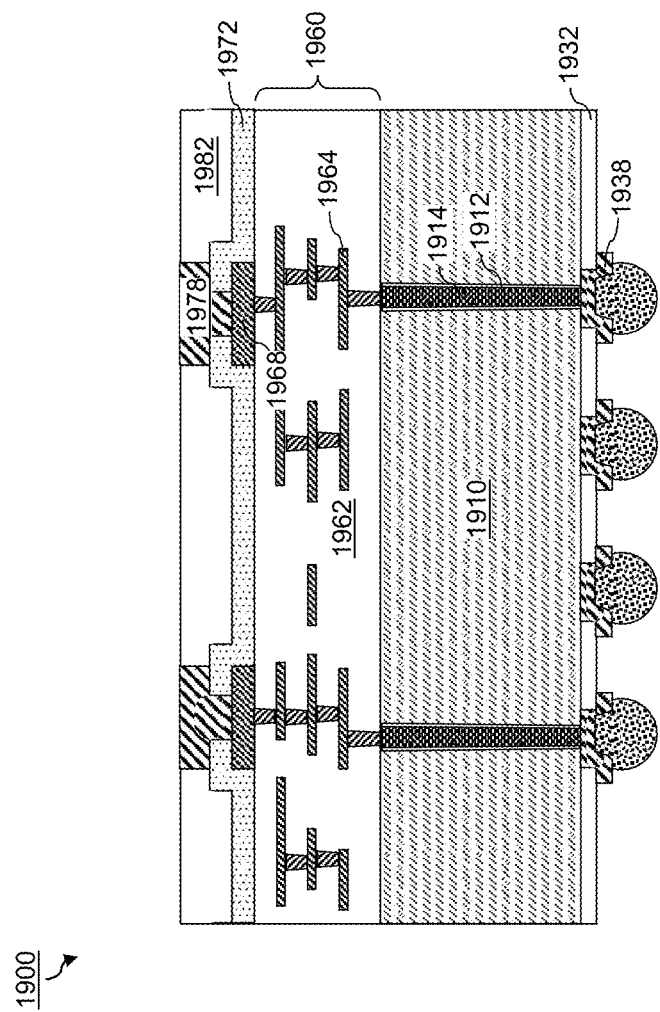
FIG. 19 is vertical cross-sectional view of a local silicon interconnect, according to various embodiments.

FIG. 19 is vertical cross-sectional view of a local silicon interconnect 1900, according to various embodiments. The local silicon interconnect 1900 is another example of an active or passive electrical device 206 that may be attached to the redistribution layers 202 of the semiconductor device 200 (e.g., see FIG. 2), according to various embodiments. The local silicon interconnect 1900 may include a silicon substrate 1910, a respective set of TSV structures 1914 vertically extending through the respective silicon substrate 1910, a set of interconnect-level dielectric layers 1962 embedding a respective set of metal interconnect structures 1964, a set of metal bonding structures 1978, and a set of backside bonding pads 1938. The set of interconnect-level dielectric layers 1962 the set of metal interconnect structures 1964 form an interconnect-level structure 1960. In one embodiment, the local silicon interconnect 1900 may be configured to be attached to the redistribution layers 202 of the semiconductor device 200 (e.g., see FIG. 2) such that at least one set of metal interconnect structures 1964 within the at least one local silicon interconnect 1900 may provide electrically conductive paths that connect a respective pair of interconnects within the redistribution layers 202. The TSV structures 1914 may be separated, and electrically isolated, from the silicon substrate 1910 by an insulating layer 1912.

A total number of metal line levels in the interconnect-level structure 1964 may be in a range from 2 to 12, such as from 3 to 6, although smaller and larger numbers of metal line levels may also be used. Metal pad structures 1968 may be formed at the topmost level of the interconnect-level structure 1964. A passivation dielectric layer 1972 such as a silicon nitride layer may be deposited over the metal pad structures 1968. The thickness of the passivation dielectric layer 1972 may be in a range from approximately 30 nm to approximately 100 nm. Metal bonding structures 1978 may be formed on each metal pad structure 1968. The metal bonding structures 1978 may be configured for C4 (controlled collapse chip connection) bonding or may be configured for C2 bonding. In embodiments in which the metal bonding structures 1978 may be configured for C4 bonding, the metal bonding structures 1978 may include copper pads having a thickness in a range from approximately 5 microns to approximately 30 microns and having a pitch in a range from 40 microns to 100 microns. In embodiments in which the metal bonding structures 1978 are configured for C2 bonding, the metal bonding structures 1978 may include copper pillars having a diameter in a range from approximately 10 microns to approximately 30 microns and having a pitch in a range from 20 microns to 60 microns. In such an embodiment, the copper pillars may be subsequently capped with a solder material to provide C2 bonding.

Subsequently, a temporary carrier substrate (not shown) may be attached to the metal bonding structures 1978 and an optional pad-level dielectric layer 1982. A temporary adhesive layer (not shown) may be used to attach the temporary carrier substrate to the surfaces of the metal bonding structures 1978 and the optional pad-level dielectric layer 1982. The temporary carrier substrate may have the same size as the silicon substrate 1910.

During fabrication of the local silicon interconnect 1900, a backside of the silicon substrate 1910 may be thinned until bottom surfaces of the TSV structures 1914 are physically exposed. The thinning of the silicon substrate 1910 may be effected, for example, by grinding, polishing, an isotropic etch process, an anisotropic etch process, or a combination thereof. For example, a combination of a grinding process, an isotropic etch process, and a polishing process may be used to thin the backside of the silicon substrate 1910. The thickness of the silicon substrate 1910 after thinning may be in a range from 20 microns to 150 microns, such as from 50 microns to 100 microns. The thickness of the silicon substrate 1910 after thinning may be thin enough to physically expose backside surfaces (i.e., bottom surfaces) of the TSV structures 1914, and may be thick enough to provide sufficient mechanical strength to each silicon substrate 1910 upon dicing the silicon substrate 1910.

At least one dielectric material such as silicon nitride and/or silicon oxide may be deposited over the backside surface of the silicon substrate 1910 and over the physically exposed end surfaces of the TSV structures 1914 to form a backside insulating layer 1932. The thickness of the backside insulating layer 1932 may be in a range from 100 nm to 1,000 nm, such as from 200 nm to 500 nm, although lesser and greater thicknesses may also be used. Openings may be formed through the backside insulating layer 1932, for example, by applying and lithographically patterning a photoresist layer, and transferring the pattern of the openings in the photoresist layer through the backside insulating layer 1932 using an anisotropic etch process. A bottom surface of each TSV structure 1914 may be physically exposed. The photoresist layer may be subsequently removed, for example, by ashing. At least one conductive material may be deposited on the physically exposed bottom surfaces of the TSV structures 1914 and may be patterned to form backside bonding pads 1938.

Figure 20A:
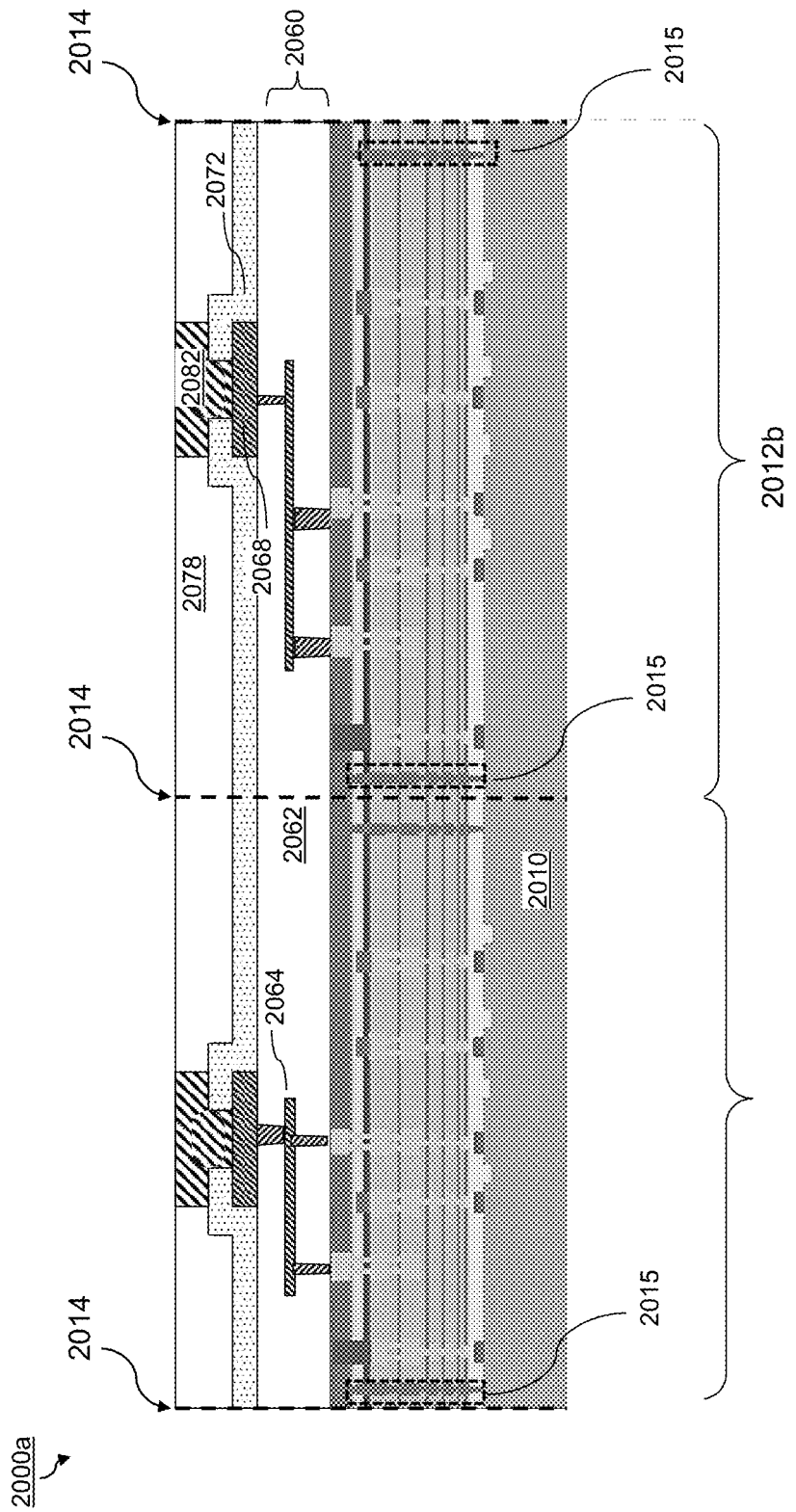
FIG. 20A is a vertical cross-sectional view of an integrated passive device, according to various embodiments.

FIG. 20A is a vertical cross-sectional view of an integrated passive device 2000a, according to various embodiments. The integrated passive device 2000a is another example of an active or passive electrical device 206 that may be attached to the redistribution layers 202 of the semiconductor device 200 (e.g., see FIG. 2), according to various embodiments. The integrated passive device 2000a may include any passive device that may be formed within, or on, a substrate such as a silicon substrate 2010, a dielectric substrate, or a metallic substrate. For example, the integrated passive device 2000a may include at least one capacitor, at least one inductor, at least one resistor, at least one diode, at least one antenna, or any other passive electrical component. In this example, the integrated passive device 2000a may include a first die 2012a and a second die 2012b.

The configuration of FIG. 20A is only illustrative, and other embodiments may include any other configuration for capacitors or for any other integrated passive device. The silicon substrate 2010 may be provided as a portion of a silicon substrate 1910 (e.g., see FIG. 19) having a plurality of integrated passive device dies (2012a, 2012b, etc.) formed thereon. In this regard, a two-dimensional array of dies (2012a, 2012b, etc.) each including a respective passive device may be formed, and may be subsequently diced, along scribe lines 2014, to provide a silicon substrate 2010 having one or more dies (2012a, 2012b, etc.). Each of the one or more dies (2012a, 2012b) may further include a seal ring 2015, as described in greater detail with reference to FIG. 20B, below.

An interconnect-level structure 2060 including interconnect-level dielectric layers 2062 and metal interconnect structures 2064 may be formed on a front-side surface of the silicon substrate 2010 prior to dicing. The interconnect-level dielectric layers 2062 may include a respective dielectric material layer such as silicon oxide, organosilicate glass, silicon nitride, or any other dielectric material that may be used as interconnect-level insulating layers. The metal interconnect structures 2064 may include metal lines and metal via structures. For example, a thickness of each metal line and the thickness of each metal via may be in a range from approximately 100 nm to approximately 1,000 nm, such as from approximately 150 nm to approximately 600 nm, although other embodiments may include smaller or larger thicknesses. The metal interconnect structures 2064 may include copper, aluminum, tungsten, molybdenum, ruthenium, or other transition metals that may be formed as patterned structures. Other suitable materials may be within the contemplated scope of disclosure.

A total number of metal line levels in the interconnect-level structure 2060 may be in a range from 1 to 8, such as from 2 to 4, although smaller and larger numbers of metal line levels may also be used. Metal pad structures 2068 may be formed at the topmost level of the interconnect-level structure 2060. A passivation dielectric layer 2072 such as a silicon nitride layer may be deposited over the metal pad structures 2068. The thickness of the passivation dielectric layer 2072 may be in a range from approximately 30 nm to approximately 100 nm. Metal bonding structures 2082 may be formed on each metal pad structure 2068. An optional pad-level dielectric layer 2078, surrounding the metal bonding structure 2082, may also be provided. The metal bonding structures 2068 may be configured for C4 (controlled collapse chip connection) bonding or may be configured for C2 bonding. The silicon substrate 2010 with the interconnect-level structure 2060 may be subsequently diced, along scribe lines 2014, to provide a plurality of integrated passive devices 2000a.

Figure 20B:
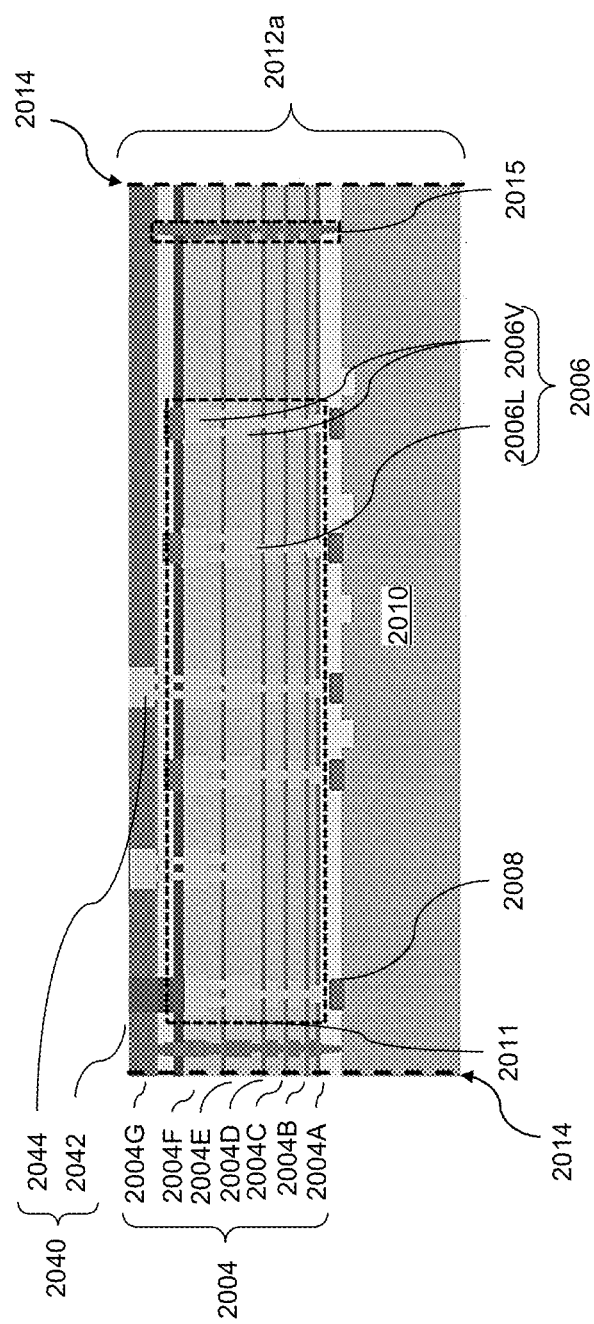
FIG. 20B is a vertical cross-sectional view of the first die of FIG. 20A, according to various embodiments.

FIG. 20B is a vertical cross-sectional view of the first die 2012a of FIG. 20A, according to various embodiments. As described above, the first die 2012a may be an integrated passive device die. In other embodiments, the first die 2012a may be, for example, an application-specific integrated circuit (ASIC) chip, an analog chip, a sensor chip, a wireless and radio frequency chip, a voltage regulator chip, or a memory chip. In some embodiments, the first die 2012a may be an active component or a passive component. In some embodiments, the first die 2012a may include the semiconductor substrate 2010, a dielectric structure 2004, an interconnect structure 2011 embedded within the dielectric structure 2004, a seal ring 2015, and a bonding structure 2040.

In some embodiments, the semiconductor substrate 2010 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 2010 may be a semiconductor-on-insulator (SOI) substrate. In various embodiments, the semiconductor substrate 2010 may take the form of a planar substrate, a substrate with multiple fins, nanowires, or other forms known to persons of ordinary skill in the art. Depending on the requirements of design, the semiconductor substrate 2010 may be a p-type substrate or an n-type substrate and may have doped regions therein. The doped regions may be configured for an n-type device or a p-type device.

In some embodiments, the semiconductor substrate 2010 may include isolation structures defining at least one active area, and a device layer may be disposed on/in the active area. The device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the device layer may include a gate structure, source/drain regions, spacers, and the like.

The dielectric structure 2004 may be disposed on a front side of the semiconductor substrate 2010. In some embodiments, the dielectric structure 2004 may include silicon oxide, silicon oxynitride, silicon nitride, a low dielectric constant (low-k) material, or a combination thereof. The dielectric structure 2004 may be a single layer or a multiple-layer dielectric structure. For example, as shown in FIG. 20B, the dielectric structure 2004 may include multiple dielectric layers, such as a substrate planarization layer 2004A, inter-layer dielectric (ILD) layers 2004B-2004F, and an interconnect planarization layer 2004G. However, while FIG. 20B illustrates seven dielectric layers, the various embodiments of the present disclosure are not limited to any particular number of layers, more or fewer layers may be used.

The dielectric structure 2004 may be formed by any suitable deposition process. Herein, "suitable deposition processes" may include a chemical vapor deposition (CVD) process, a physical vapor deposition (PVD) process, an atomic layer deposition (ALD) process, a high-density plasma CVD (HDPCVD) process, a metalorganic CVD (MOCVD) process, a plasma enhanced CVD (PECVD) process, a sputtering process, laser ablation, etc.

An interconnect structure 2011 may be formed in the dielectric structure 2004. The interconnect structure 2011 may include metal features 2006 disposed in the dielectric structure 2004. The metal features 2006 may be any of a variety of vias (2006V) and metal lines (2006L). The metal features 2006 may be formed of any suitable electrically conductive material, such as tungsten (W), copper (Cu), a copper alloy, aluminum (Al), an aluminum alloy, combinations thereof, etc. In some embodiments, barrier layers (not shown) may be disposed between the metal features 2006 and the dielectric layers of dielectric structure 2004, to prevent the material of the metal features 2006 from migrating to the semiconductor substrate 2010. The barrier layer may include Ta, TaN, Ti, TiN, CoW, or combinations thereof, for example. Other suitable barrier layer materials are within the contemplated scope of disclosure.

The metal features 2006 may include electrically conductive lines 2006L and vias 2006V. The vias 2006V may operate to electrically connect conductive lines 2006L disposed in adjacent dielectric layers 2004B-2004F. The metal features 2006 may be electrically connected to pads 2008 disposed on the semiconductor substrate 2010, such that the interconnect structure 2011 may electrically connect semiconductor devices formed on the semiconductor substrate 2010 to various pads and nodes.

The seal ring 2015 may extend around the periphery of the first die 2012a. For example, the seal ring 2015 may be disposed in the dielectric structure 2004 and may laterally surround the interconnect structure 2011. The seal ring 2015 may be configured to protect the interconnect structure 2011 from contaminant diffusion and/or physical damage during device processing, such as plasma etching and/or deposition processes.

The seal ring 2015 may include copper at an atomic percentage greater than 80%, such as greater than 90% and/or greater than 95% although greater or lesser percentages may be used. The seal ring 2015 may include conductive lines and via structures that may be connected to each other and may be formed simultaneously with the conductive lines 2006L and vias 2006V of the metal features 2006 of the interconnect structure 2011. The seal ring 2015 may be electrically isolated from the metal features 2006.

In some embodiments, the metal features 2006 and/or the seal ring 2015 may be formed by a dual-Damascene process or by multiple single Damascene processes. Single-Damascene processes generally form and fill a single feature with copper per Damascene stage. Dual-Damascene processes generally form and fill two features with copper at once, for example, a trench and overlapping through-hole may both be filled with a single copper deposition using dual-Damascene processes. In alternative embodiments, the metal features 2006 and/or the seal ring 2015 may be formed by an electroplating process.

In an example embodiment, the Damascene processes may include patterning the dielectric structure 2004 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that may be disposed on top of the dielectric structure 2004.

The patterning, metal deposition, and planarizing processes may be performed for each of the dielectric layers 2004A-2004G, to thereby form the interconnect structure 2011 and/or the seal ring 2015. For example, dielectric layer 2004A may be deposited and patterned to form openings. A deposition process may then be performed to fill the openings in the dielectric layer 2004A. A planarization process may then be performed to remove the overburden and form metal features 2006 in the dielectric layer 2004A. These process operations may be repeated to form the dielectric layers 2004B-2004F and the corresponding metal features 2006, and thereby complete the interconnect structure 2011 and/or seal ring 2015.

The first die 2012a may include a bonding structure 2040 disposed over the dielectric structure 2004. The bonding structure 2040 may include a dielectric bonding layer 2042 and one or more bonding features 2044. The bonding layer 2042 may be formed by depositing a dielectric material, such as silicon oxide, silicon nitride, a polymer, or a combination thereof, using any suitable deposition process. The bonding features 2044 may be disposed in the bonding layer 2042. The bonding features 2044 may be electrically conductive features formed of the same materials as the metal features 2006. For example, the bonding features 2044 may include tungsten (W), copper (Cu), a copper alloy, aluminum (Al), an aluminum alloy, or a combination thereof. Other suitable bonding structure materials are within the contemplated scope of disclosure. The bonding features 2044 may include bonding pads and/or via structures, in some embodiments. The bonding features 2044 may be formed in the bonding layer 2042 by a dual-Damascene processes, or by one or more single-Damascene processes, as described above. In alternative embodiments, the bonding features 2044 may be formed by an electroplating process.

Figures 21A, 21B:
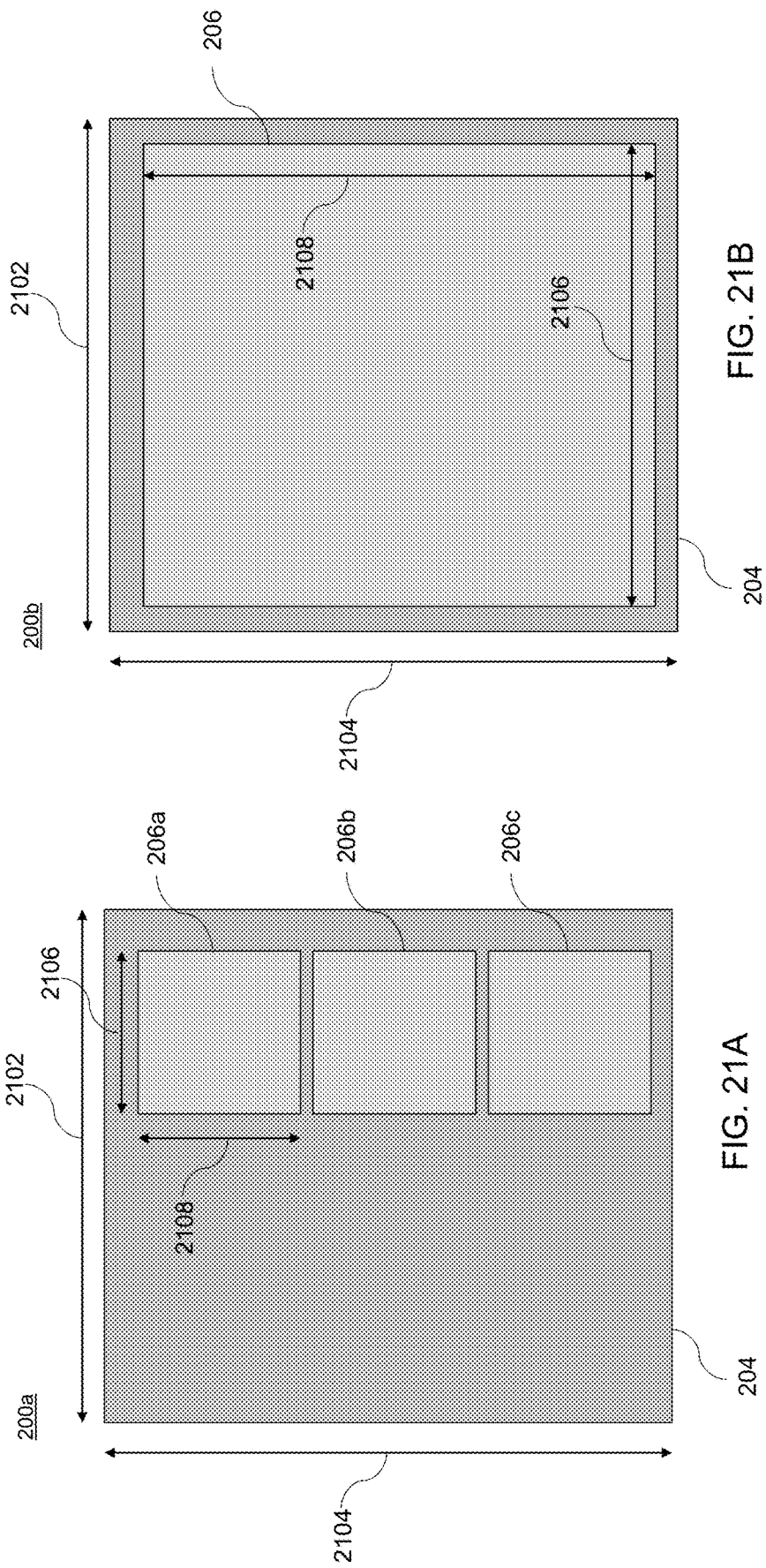
FIG. 21A is top view of a semiconductor device having a plurality of active or passive devices, according to various embodiments.
FIG. 21B is top view of a semiconductor device having a single active or passive devices, according to various embodiments.

FIG. 21A is top view of a semiconductor device 200a having a plurality of active or passive devices (206a, 206b, 206c), and FIG. 21B is top view of a semiconductor device 200b having a single active or passive electrical device 206, according to various embodiments. The example embodiments of FIGS. 21A and 21B illustrate two possible configurations of semiconductor devices (200a, 200b). The semiconductor device 200a includes three active or passive devices (206a, 206b, 206c). Each of the active or passive devices (206a, 206b, 206c) may be configured as an active or passive device as described above with reference to FIGS. 2, 19, 20A, and 20B. Further, in some embodiments, each of the active or passive devices (206a, 206b, 206c) may have a common configuration or each may have a different configuration.

In the example embodiment of FIG. 21A, the active wafer 204 may have a width 2102 that is approximately 12.3 mm and a length 2104 that approximately 13.6 mm. Each of the active or passive devices (206a, 206b, 206c) may have a width 2106 that is approximately 3.9 mm and a length 2108 that is approximately 3.9 mm. In the example embodiment of FIG. 21B, the active wafer 204 may have a width 2102 that is approximately 13.7 mm and a length 2104 that approximately 15.0 mm. The single active or passive electrical device 206 may have a width 2106 that is approximately 12.3 mm and a length 2108 that is approximately 13.6 mm. Various other embodiment semiconductor devices (200, 200a, 200b, etc.) may have other numbers of active or passive devices (206, 206a, 206b, 206c) which may have other sizes and shapes.

Figure 22:
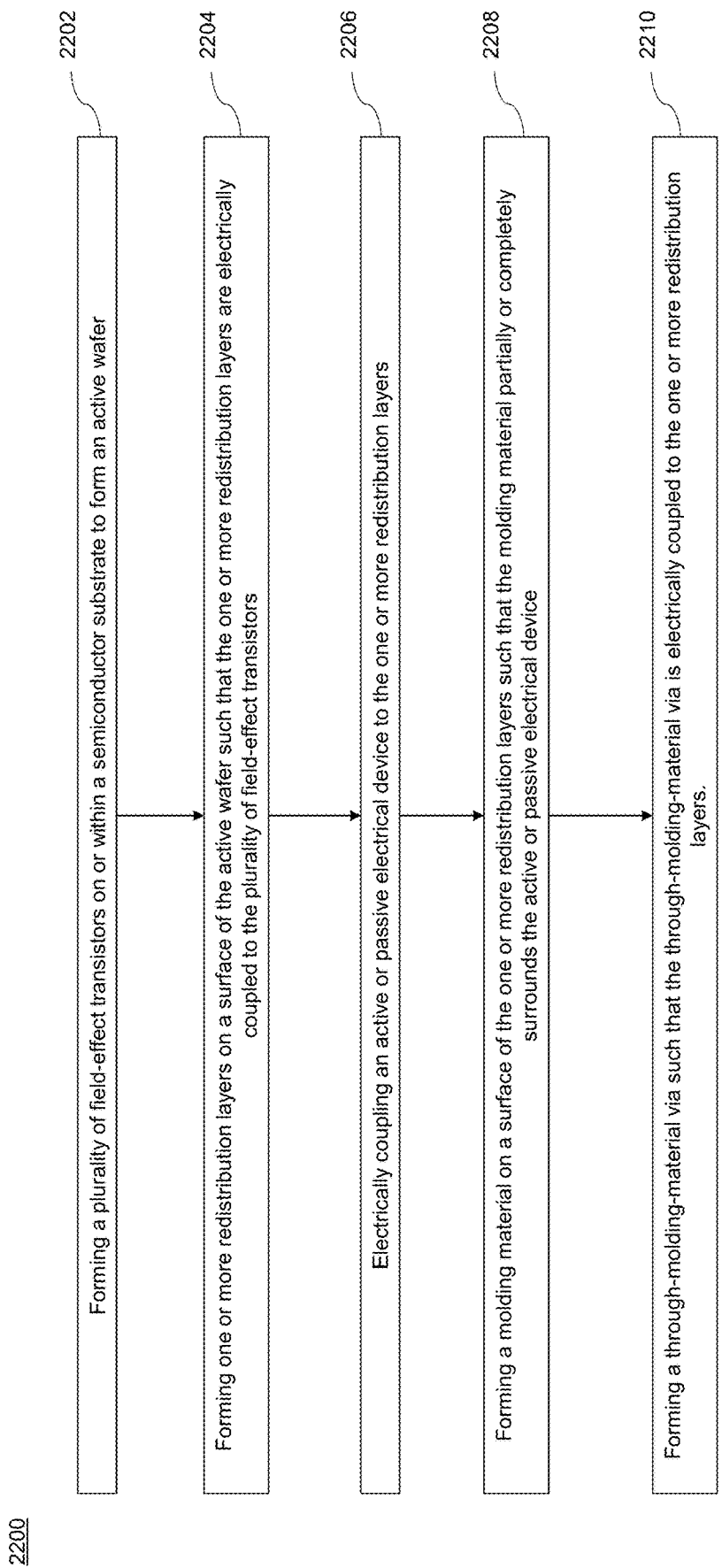
FIG. 22 is a flowchart illustrating operations of a method of fabricating a semiconductor device, according to various embodiments.

FIG. 22 is a flowchart illustrating operations of a method 2200 of fabricating a semiconductor device (200, 200a, 200b), according to various embodiments. In operation 2202, the method 2200 may include forming a plurality of field-effect transistors 308 (e.g., see FIG. 3) on or within a semiconductor substrate 302 to form an active wafer 204 (e.g., see FIG. 2). In operation 2204, the method 2200 may include forming one or more redistribution layers 202 on a surface of the active wafer 204 such that the one or more redistribution layers 202 are electrically coupled to the plurality of field-effect transistors 308. In operation 2206, the method 2200 may include electrically coupling an active or passive electrical device 206 (e.g., see FIGS. 2 and 19 to 20B) to the one or more redistribution layers 202.

In operation 2208, the method 2200 may further include forming a molding material matrix 216 on a surface of the one or more redistribution layers 202 such that the molding material matrix 216 partially or completely surrounds the active or passive electrical device 206. In operation 2210, the method 2200 may further include forming a through-molding-material via 218 such that the through-molding-material via 218 is electrically coupled to the one or more redistribution layers 202. According to an embodiment, the active or passive device 206 may further include a silicon substrate 208 and a through-silicon-via 210, and the method 2200 may further include forming metal bonding structures (124, 422) over top surfaces of the through-silicon-via 210 and the through-molding-material via 218 such that the metal bonding structures (124, 422) are electrically coupled to the through-silicon-via 210 and the through-molding-material via 218. The method 2200 may further include forming a solder mask 408 over the molding material matrix 216 prior to forming the metal bonding structures (124, 422) such that the solder mask 408 includes openings 410 through which top surfaces of the through-silicon-via 210 and the through-molding-material via 218 are exposed.

A further embodiment method of fabricating a semiconductor device (200, 200a, 200b) may include forming one or more redistribution layers 202 on a surface of a semiconductor die (104, 106) such that the one or more redistribution layers 202 are electrically coupled to the semiconductor die (104, 106); forming a molding material matrix 216 on a surface of the one or more redistribution layers 202; and forming a through-molding-material via 218 that is electrically coupled to the one or more redistribution layers 202. The method may further include electrically coupling an active or passive electrical device 206 (e.g., see FIGS. 2 and 19 to 20B) to the one or more redistribution layers 202.

The operation of forming the molding material matrix 216 may further include partially or completely surrounding the active or passive electrical device 206 with the molding material matrix 216. The method may further include forming the active or passive electrical device 206 such that the active or passive device 206 includes a silicon substrate 208 and a through-silicon-via 210 formed in the silicon substrate 208. The method may further include forming the active or passive electrical device 206 as an integrated passive device 206 including a deep trench capacitor 212. In a further embodiment, the method may include forming the active or passive electrical device 206 as a local silicon interconnect 1900 (e.g., see FIG. 19) that provides electrical connections between two or more circuit components of the semiconductor die (104, 106).

A further embodiment method of fabricating a semiconductor device (200, 200a, 200b) may include forming one or more first redistribution layers 202 directly on a surface of a semiconductor die (104, 106) such that the one or more first redistribution layers 202 are electrically coupled to the semiconductor die (104, 106), forming one or more second redistribution layers (402, 406) directly on a surface of an active or passive electrical device 206, and electrically coupling the active or passive electrical device 206 to the one or more first redistribution layers 202. The method may further include forming the active or passive electrical device 206 such that the active or passive device 206 comprises a silicon substrate 208 and a through-silicon-via 210 formed in the silicon substrate 208. The method may further include forming the active or passive electrical device 206 as an integrated passive device 206 including a deep trench capacitor 212. In a further embodiment, the method may include forming the active or passive electrical device 206 as a local silicon interconnect 1900 (e.g., see FIG. 19) that provides electrical connections between two or more circuit components of the semiconductor die (104, 106).

The method may further include forming a molding material matrix 216 on a surface of the one or more first redistribution layers 202 such that the molding material matrix 216 partially or completely surrounds the active or passive electrical device 206. The method may further include forming a through-molding-material via 218 such that the through-molding-material via 218 is electrically coupled to the one or more first redistribution layers 202. According to an embodiment, the active or passive device 206 may further include a silicon substrate 208 and a through-silicon-via 210, and the method 2200 may further include forming metal bonding structures (124, 422) over top surfaces of the through-silicon-via 210 and the through-molding-material via 218 such that the metal bonding structures (124, 422) are electrically coupled to the through-silicon-via 210 and the through-molding-material via 218.

The method 2200 may further include forming a solder mask 408 over the molding material matrix 216 prior to forming the metal bonding structures (124, 422) such that the solder mask 408 includes openings 410 through which top surfaces of the through-silicon-via 210 and the through-molding-material via 218 are exposed. The method may further include forming the active or passive electrical device 206 as an integrated passive device comprising a seal ring 2015, such that the seal ring 2015 is electrically isolated from electrical device components of the integrated passive device. The method may further include forming metal features 2006 within the integrated passive device 206 using a single Damascene or duel-Damascene process to form the metal features 2006 and the seal ring 2015.

Referring to all drawings and according to various embodiments of the present disclosure, a semiconductor device (200, 200a, 200b; see FIGS. 2, 21A, and 21B) is provided. The semiconductor device (200, 200a, 200b) may include a semiconductor die (104, 106); one or more redistribution layers 202 formed on a surface of semiconductor die (104, 106) and electrically coupled to the semiconductor die (104, 106); and an active or passive electrical device (206, 206a, 206b, 206c) electrically coupled to the one or more redistribution layers 202. The active or passive electrical device (206, 206a, 206b, 206c) may include a silicon substrate 208 and a through-silicon-via 210 formed in the silicon substrate 208. The active or passive electrical device 206 may be configured as an integrated passive device 206 including a deep trench capacitor 212.

In other embodiments, the active or passive electrical device 206 may be configured as a local silicon interconnect 1900 (e.g., see FIG. 19). The active or passive electrical device (206, 1900) may include a second semiconductor substrate (1910, 2010), a dielectric structure (1962, 2062), an interconnect structure (1964, 2064) embedded within the dielectric structure (1962, 2062), a seal ring 2015 (e.g., see FIGS. 20A and 20B), and a bonding structure (124, 1978, 2040). The semiconductor device 200 (e.g., see FIG. 2) may further include an underfill material 214 formed between a surface of the one or more redistribution layers 202 and a surface of the active or passive electrical device 206. The semiconductor device 200 may further include a molding material matrix 216 formed on a surface of the one or more redistribution layers 202 such that the molding material matrix 216 partially or completely surrounds the active or passive electrical device 206. The semiconductor device 200 may further include a through-molding-material via 218, formed in the molding material matrix 216, which is electrically coupled to the one or more redistribution layers 202. In some embodiments, the semiconductor die (104, 106) may be configured as a system-on-chip die. In further embodiments, the active or passive electrical device 206 may be configured as a local silicon interconnect 1900 (e.g., see FIG. 19) that provides electrical connections between two or more circuit components of the system-on-chip die.

The above-described embodiments may provide advantages over existing semiconductor package structures. In this regard, disclosed embodiments may simplify the formation of a semiconductor package structure by providing a semiconductor device 200 that includes redistribution interconnect layers 202 (similar to those of an interposer) formed directly on an active wafer 204 or semiconductor die (104, 106). In this way, a number of processing steps may be reduced and the use of intermediate carrier substrates may be avoided. In such embodiments, the active wafer 204 (or semiconductor die (104, 106)), itself, may serve as the only substrate used in forming the semiconductor device 200. Such a semiconductor device 200 may be configured as a modular component that may be attached to a package substrate 110 without an interposer 108. In some embodiments, the redistribution layers 202 of the semiconductor device 200 may have a smaller lateral extent than those of an interposer 108 that may be formed separately. This smaller size may act to reduce or mitigate issues related to thermal expansion stresses that may otherwise exist in a semiconductor package having semiconductor dies (104, 106) attached to a separate interposer 108.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a plurality of field-effect transistors on or within a semiconductor substrate to form an active wafer;
    forming one or more redistribution layers on a surface of the active wafer such that the one or more redistribution layers are electrically coupled to the plurality of field-effect transistors;
    forming a through-molding-material via on the one or more redistribution layers; and
    attaching an interconnect die to the one or more redistribution layers such that the interconnect die is adjacent the through-molding-material via and coupled to the one or more redistribution layers.

2. The method of claim 1, further comprising:
    forming a molding material matrix on a surface of the one or more redistribution layers such that the molding material matrix partially or completely surrounds the interconnect die and the through-molding-material via.

3. The method of claim 2, wherein the forming of the through-molding-material via comprises forming the through-molding-material via such that the through-molding-material via is electrically coupled to the one or more redistribution layers.

4. The method of claim 3, wherein the interconnect die further comprises a silicon substrate and a through-silicon-via;
    the method further comprising:
    forming metal bonding structures over top surfaces of the through-silicon-via and the through-molding-material via such that the metal bonding structures are electrically coupled to the through-silicon-via and the through-molding-material via.

5. The method of claim 4, further comprising:
    forming a solder mask over the molding material matrix prior to forming the metal bonding structures,
    wherein forming the solder mask further comprises forming openings in the solder mask through which top surfaces of the through-silicon-via and the through-molding-material via are exposed.

6. A method of fabricating a semiconductor device, comprising:
    forming one or more redistribution layers on a surface of a semiconductor die such that the one or more redistribution layers are electrically coupled to the semiconductor die;
    forming a molding material matrix on a surface of the one or more redistribution layers;
    forming a through-molding-material via that is electrically coupled to the one or more redistribution layers; and
    attaching an interconnect die to the one or more redistribution layers such that the interconnect die is adjacent the through-molding-material via and coupled to the one or more redistribution layers.

7. The method of claim 6,
wherein forming the molding material matrix further comprises partially or completely surrounding the interconnect die with the molding material matrix.

8. The method of claim 7, further comprising:
forming the interconnect die such that the interconnect die comprises a silicon substrate and a through-silicon-via formed in the silicon substrate.

9. The method of claim 7, further comprising:
forming a plurality of metal bumps on the one or more redistribution layers, wherein the attaching of the interconnect die comprises attaching the interconnect die to the plurality of metal bumps.

10. The method of claim 7, wherein the attaching of the interconnect die comprises attaching the interconnect die such that the interconnect die provides electrical connections between two or more circuit components of the semiconductor die.

11. A method of fabricating a semiconductor device, comprising:
forming one or more first redistribution layers directly on a surface of a semiconductor die such that the one or more first redistribution layers are electrically coupled to the semiconductor die;
forming one or more second redistribution layers directly on a surface of an interconnect die;
forming a through-molding-material via on the one or more first redistribution layers; and
attaching the interconnect die to the one or more first redistribution layers such that the interconnect die is adjacent the through-molding-material via and coupled to the one or more first redistribution layers.

12. The method of claim 11, further comprising:
forming the interconnect die such that the interconnect die comprises a silicon substrate and a through-silicon-via formed in the silicon substrate.

13. The method of claim 11, further comprising:
forming a plurality of metal bumps on the one or more first redistribution layers, wherein the attaching of the interconnect die comprises attaching the interconnect die to the plurality of metal bumps.

14. The method of claim 11, wherein the interconnect die provides electrical connections between two or more circuit components of the semiconductor die.

15. The method of claim 11, further comprising:
forming a molding material matrix on a surface of the one or more first redistribution layers such that the molding material matrix partially or completely surrounds the interconnect die and the through-molding-material via.

16. The method of claim 15, wherein the forming of the through-molding-material via comprises forming the through-molding-material via such that the through-molding-material via is electrically coupled to the one or more first redistribution layers.

17. The method of claim 16, wherein the interconnect die further comprises a silicon substrate and a through-silicon-via;
the method further comprising:
forming metal bonding structures over top surfaces of the through-silicon-via and the through-molding-material via such that the metal bonding structures are electrically coupled to the through-silicon-via and the through-molding-material via.

18. The method of claim 17, further comprising:
forming a solder mask over the molding material matrix prior to forming the metal bonding structures,
wherein forming the solder mask further comprises forming openings in the solder mask through which top surfaces of the through-silicon-via and the through-molding-material via are exposed.

19. The method of claim 11, further comprising:
forming the interconnect die such that the interconnect die comprises interconnect-level dielectric layers and a metal interconnect structure in the interconnect-level dielectric layers.

20. The method of claim 19, wherein the forming of the interconnect die further comprises forming the interconnect die to include a metal pad structure on the interconnect-level dielectric layers, a passivation layer on the metal pad structure and a metal bonding structure on the metal pad structure.

* * * * *